US006399399B2

(12) United States Patent
Yamamoto

(10) Patent No.: US 6,399,399 B2
(45) Date of Patent: Jun. 4, 2002

(54) METHOD FOR MANUFACTURING SEMICONDUCTOR MEMORY AND METHOD FOR MANUFACTURING CAPACITOR

(75) Inventor: Tomoe Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/842,751

(22) Filed: Apr. 25, 2001

(30) Foreign Application Priority Data

Apr. 28, 2000 (JP) ........................................ 2000-131877

(51) Int. Cl.[7] ........................................ H01L 21/8242
(52) U.S. Cl. ............................ 438/3; 438/253; 438/240
(58) Field of Search ............................ 438/3, 238–241, 438/253–256, 381, 396–399

(56) References Cited

U.S. PATENT DOCUMENTS 6,078,093 A * 6/2000 Lee ............................ 257/532
6,271,083 B1 * 8/2001 Lou ............................ 438/253

FOREIGN PATENT DOCUMENTS

JP 7-94600 4/1995

* cited by examiner

*Primary Examiner*—Jey Tsai
(74) *Attorney, Agent, or Firm*—Darryl G. Walker

(57) ABSTRACT

A method of manufacturing a semiconductor memory cell is provided. The semiconductor memory cell can include a memory cell transistor (10) and a capacitor. The capacitor can be formed in a groove (13) formed in an interlayer insulation film (12). The capacitor can have a lower electrode including a selective growth film (18) which may be selectively deposited on a lower electrode film (16). Selective growth film (18) can be a ruthenium film having a thickness of approximately 5~10 nm and may serve as a buffer which may prevent lower electrode and a capacitor insulation film (20) from deterioration in integrity which could cause increased leakage currents.

20 Claims, 18 Drawing Sheets

METHOD FOR MANUFACTURING SEMICONDUCTOR MEMORY AND METHOD FOR MANUFACTURING CAPACITOR

TECHNICAL FIELD

The present invention relates generally to semiconductor memory devices and more particularly to a method for manufacturing a capacitor in a semiconductor memory device.

BACKGROUND OF THE INVENTION

Semiconductor devices including both memory and logic products are developed with what is known as large scale integration (LSI) in which millions of devices can be integrated on a single chip. In these cases, much effort has been put forth in developing manufacturing technology in order to build these semiconductor devices. In particular, efforts have been made at developing technology that will enable denser semiconductor memory devices to be manufactured.

Semiconductor memories having a random access can be divided into DRAM (dynamic random access memory) and SRAM (static random access memory). These semiconductor memories are typically developed using MOS (metal oxide semiconductor) transistors, due to their superior integration capabilities and/or lower power consumption. A DRAM typically has a smaller cell size than an SRAM, which allows a DRAM to have a denser memory size and can typically store more bits on a single chip. This allows a lower cost per bit and makes DRAM the preferred semiconductor memory in many applications.

In a DRAM, a memory cell (DRAM cell) has a memory cell transistor (pass transistor) and a capacitor (storage capacitor). The capacitor is connected to the memory cell transistor and is used for storing information. The data value of information stored in a DRAM cell is determined by the presence or absence of charge on the capacitor. Capacitors having a MIM (metal-insulator-metal) structure are widely adopted.

The cost per unit of DRAM can be lowered by increasing the number of DRAM chips that can be manufactured on a single wafer and/or by increasing the amount of data that can be stored on a single DRAM chip. In order to increase the volume of information that can be stored on a single DRAM and/or decrease the cost per bit in a DRAM by decreasing chip size, smaller memory cells are desired. However, as memory cell size decreases, the area of the cell capacitor also decreases. The decrease in capacitor size typically decreases the capacitance. Thus, the capacitor can store less charge. This affects the integrity of the data stored in a DRAM cell. External noise and/or other affects can introduce errors (known as soft errors) in the stored information due to the critical charge required to properly determine a logic value in a DRAM cell.

In order to increase the capacitance of the cell capacitor in a DRAM, high dielectric insulation films have been used as the dielectric for cell capacitors. High dielectric insulation films are typically various forms of oxide films such metal oxides such as tantalum oxide ($Ta_2O_5$), lead zirconium titanate (PZT), barium titanate (BTO), and strontium titanate (STO). For example, silicon oxide/dioxide ($SiO_2$) has been used as the dielectric for cell capacitors for many years. Tantalum oxide has a dielectric constant that is approximately ten times higher than the dielectric constant of silicon dioxide. Furthermore, the dielectric constant of tantalum oxide is about four times higher than that of silicon nitride, which has been used to increase the capacitance of the DRAM cell capacitors.

The capacitance of the cell capacitors can also be increased by increasing the area of the upper and/or lower capacitor electrodes. This can be done by utilizing three-dimensional structures such as cylindrical, boxy, or fin type shapes. The capacitance can be increased even further by combining such a three-dimensional structure with a high dielectric constant insulation film.

A conventional method of making a semiconductor memory (DRAM) cell will now be explained with reference to FIGS. 12A to 14F. FIGS. 12A to 14F illustrate cross-sections of a conventional DRAM cell after various process steps have been completed.

Referring now to FIG. 12A, a P-type silicon substrate 51 has pass transistors 60 formed in a memory array region. A separation insulation film 52 such as silicon oxide formed on the substrate base 51 by LOCOS (local oxidation of silicon) method. Inside each active region surrounded by the separation insulation film 52, a gate oxide film 53 and a gate electrode (word line) 54 are formed. A plurality of N-type diffusion regions 55 forming a source region or drain region for transistors 60 are selectively formed. The surface of the device is then covered by an interlayer insulation film 56.

In this manner, an array of MOS-type memory cell transistors 60 are formed. Each include a gate (control) electrode 54 and a plurality of N-type diffusion regions 55 forming source/drain regions.

A contact hole 57 is then formed in the interlayer insulation film 56, so as to allow a later formed capacitor to make an electrical contact with N-type diffusion region 55. A capacitor contact 58, comprising polycrystalline silicon, is then formed in the contact hole 57. A silicon oxide nitride film 61 and plasma oxide film 62 is then formed on the interlayer insulation film 56 and a cylindrical groove 63 is formed through the plasma nitride-oxide film 61 and the plasma silicon oxide film 62 so as to expose the capacitor contact 58.

Referring now to FIG. 12B, a barrier film 65 comprised of a laminated film of TiN/Ti (titanium nitride/titanium) is then formed over the entire surface by means of CVD (chemical vapor deposition). Then, by sputtering only or sputtering in combination with CVD, a lower electrode film 66A is formed over the entire surface. Lower electrode film 66A is fabricated into a lower electrode of a predetermined pattern by patterning in a later process.

Referring now to FIG. 13C, a deposition process is performed so as to embed a resist material 67 inside each cylindrical groove 63.

Referring now to FIG. 13D, the surface of interlayer insulation film 62 is then planarized by etching to remove unneeded regions of barrier film 65 and lower electrode 66.

Referring now to FIG. 14E, resist material 67 inside cylindrical groove 63 is removed by ashing using an oxygen ($O_2$) plasma.

Referring now to FIG. 14F, a capacitance insulation film 68 and an upper electrode film 69A comprising $Ta_2O_5$ are then formed over the entire surface with CVD. Then, an upper electrode (not shown) is formed by patterning the upper electrode film 69A into a desired pattern. This completes the manufacturing of memory cell capacitors of a semiconductor memory.

However, the semiconductor memory produced by the afore-mentioned conventional process can have a drawback of inferior leakage current in the capacitor. This can be caused by the ashing of resist film 67 during the step of applying an oxygen plasma (FIG. 14E) after the planarizing step (FIG. 13D). This can cause the surface of lower electrode 66 to be degraded by damage introduced by the oxidizing plasma. Because capacitor insulation film 68 is formed on the degraded surface of lower electrode 66, the quality of capacitor insulation film 68 can also be degraded by the influence of the damaged lower electrode 66. These effects can cause the capacitor leakage current to increase. Such an increase in capacitor leakage current can cause charge to leak from the storage capacitor and can reduce read margins. This can destroy the integrity of data stored on the semiconductor memory, in particularly under "pause" conditions.

A method of manufacturing a semiconductor memory device to prevent such effects of degradation of the lower electrode produced during ashing has been disclosed in a Japanese Unexamined Patent Application, First Publication, No. Hei 7-94600 (JP 7-94600). This process will now be explained with reference to FIGS. 15A to 18H. FIGS. 15A to 18H illustrate cross-sections of a conventional DRAM cell after various process steps have been completed.

Referring now to FIG. 15A, a silicon substrate 131 has memory cell transistors 130 formed in a memory array region. Memory cell transistors 130 are formed inside an active region surrounded by channel stopper regions 135 and separation insulation films 133. Each memory cell transistor 130 is comprised of a gate oxidation film 121, gate electrode 123, and source/drain region 125. Source/drain region 125 has a low doping region 125*a* and a high doping region 125*b*. An insulation film 127 is formed over gate electrodes 123.

Referring now to FIG. 15B, a contact hole 141*a* is then formed in interlayer insulation film to expose a source/drain region 125. Contact hole 141*a* is formed by anisotropic etching of interlayer insulation film 141. Then a doped polysilicon film 143 is formed over the entire surface using a CVD process.

Referring now to FIG. 16C, doped polysilicon film 143 is then etched back to form a plug layer 143*a*. Then, a barrier layer 113 is formed over the entire surface by sputtering. A lower electrode film 101A is then formed over the entire surface by a CVD method.

Referring now to FIG. 16D, using a PVD (physical vapor deposition) method such as sputtering, a capacitor insulation film 103 comprised of PZT, for example, is then formed over the entire surface.

Referring now to FIG. 17E, a resist pattern 153 is then formed on top of capacitor insulation film 103. Then, using resist pattern 153 as a mask, patterning is carried out by successively anisotropic etching of capacitor insulation film 103, lower electrode film 101A and barrier film 113. This process forms lower electrode 101 of a desired pattern. Resist pattern 153 is then removed by ashing.

Referring now to FIG. 17F, after resist pattern 153 is removed by ashing, an insulation film 111 comprising a silicon oxide or silicon nitride film is formed over the entire surface using a CVD process.

Referring now to FIG. 18G, insulation film 111 is etched back using anistotropic etching until capacitor insulation film 103 is exposed. A sidewall insulation film 111*a* is then formed to cover the sidewall surfaces of lower electrode 101 and capacitor insulation film 103.

Referring now to FIG. 18H, an upper electrode 105 is formed over the entire surface to form capacitor 110. Capacitor 110 is comprised of lower electrode 101, capacitor insulation film 103, and upper electrode 105. Then an insulation film 145 is formed over the entire surface, thus completing the conventional manufacturing of memory cells of a semiconductor memory.

According to the conventional manufacturing method disclosed in JP 7-94600, as in the steps illustrated in FIG. 16D and 17E, after forming lower electrode film 101A and capacitor insulation film 103 in succession, lower electrode film 101A and capacitor insulation film 103 are patterned using resist pattern 153 as a mask. Then, resist pattern 153 is removed by ashing. Therefore, when ashing resist pattern 153, lower electrode film 101A is not exposed to the oxygen plasma so that the surface of lower electrode film 101A is not damaged. Thus, capacitor insulation film 103 is not deteriorated and capacitor leakage current may not be increased.

However, in the conventional manufacturing method disclosed in JP 7-94600, although deterioration in the upper electrode film may be prevented during ashing of the resist masking, the capacitor insulation film 103 can be damaged during the process of forming sidewall insulation film 111*a*.

According to the semiconductor memory manufacturing method described above, in the step indicated in FIG. 17F, during the step of forming insulation film 111 using a CVD method, damage can be created on capacitor insulation film 103, which has already been formed. In particular, when capacitor insulation film 103 is made of a combination of an oxide film such as $Ta_2O_5$ and insulation film 111 is made of a silicon oxide or silicon nitride film, the silicon oxide or silicon nitride film is produced by a reduction reaction of silane such as mono-silane ($SiH_4$) as the raw material. $Ta_2O_5$ film can be reduced during this film forming step.

Next, in the step shown in FIG. 18G, capacitor film 103 can be further damaged during the process of forming wall insulation film 111*a* by anisotropic etching in order to etch back the insulation film 111 formed by the process described above. Accordingly, because capacitor insulation film 103 can be damaged during the step of forming insulation film 111 or during an etch back step, capacitor insulation film 103 can be degraded. This can result in increasing the leakage current of the capacitor in the memory cell.

Furthermore, according to the semiconductor memory manufacturing method disclosed in JP 7-94600, when forming sidewall insulation film 111*a* as shown in FIG. 18G, fabrication precision during the anisotropic etching is important, but the control of anisotropic etching is difficult and over-etching can occur.

Referring now to FIG. 19, a cross-sections of a conventional DRAM cell when over-etching sidewall insulation film 111*a* is severe is set forth. It can be seen that if the degree of over-etching is severe, the film thickness of wall insulation film 111*a* can be reduced and lead to a situation of shorting lower electrode 101 and upper electrode 105.

In view of the above discussion, it would be desirable to provide a method for manufacturing a semiconductor memory and a capacitor that reduces damage to the capacitor insulation film. It would also be desirable to prevent increased leakage current in the memory cell capacitor.

SUMMARY OF THE INVENTION

According to the present embodiments, a method of manufacturing a semiconductor capacitor is provided. The capacitor can be formed in a groove formed in an interlayer insulation film. The capacitor can have a lower electrode including a selective growth film, which may be selectively deposited on a lower electrode film.

According to one aspect of the embodiments, groove may be a cylindrical groove.

According to another aspect of the embodiments, an interlayer insulation film may be formed over a semiconductor substrate. A capacitor contact hole may be formed in the interlayer insulation film and a capacitor contact may be formed in the capacitor contact hole.

According to another aspect of the embodiments, the capacitor contact may provide an electrical connection between a diffusion region a lower electrode of a capacitor.

According to another aspect of the embodiments, a lower electrode film may be formed on a surface of the semiconductor including in a groove formed in an interlayer insulation film.

According to another aspect of the embodiments, a resist material may be applied and processed to leave a resist film in a groove formed in an interlayer insulation film.

According to another aspect of the embodiments, excess portions of a lower electrode may be removed so as to leave the lower electrode film in a groove formed in an interlayer insulation layer.

According to another aspect of the embodiments, a resist film in a groove formed in the interlayer insulation film may be removed by ashing using an oxygen plasma.

According to another aspect of the embodiments, a selective growth film may be deposited on an upper electrode formed in a groove formed in an interlayer insulation film.

According to another aspect of the embodiments, the selective growth film may include ruthenium having a thickness of approximately 5~10 nm.

According to another aspect of the embodiments, the selective growth film may be formed by means of chemical vapor deposition or physical vapor deposition or a combination of chemical vapor deposition and physical vapor deposition.

According to another aspect of the embodiments, a capacitor insulation film may be formed over the selective growth film in the groove formed in an interlayer insulation layer.

According to another aspect of the embodiments, the capacitor film may include one of the group of tantalum oxide, lead zirconium titanate, barium titanate, or strontium titanate.

According to another aspect of the embodiments, an upper electrode film may be formed over a capacitor insulation film.

According to another aspect of the embodiments, the upper electrode film may include a ruthenium film having a thickness of approximately 5~20 nm.

According to another aspect of the embodiments, an upper capacitor electrode can include a tungsten film.

According to another aspect of the embodiments, the capacitor may be included in a semiconductor memory cell including a memory cell transistor, and the capacitor contact may provide an electrical connection between the lower electrode of the capacitor and a diffusion region of the memory cell transistor.

According to another aspect of the embodiments, the capacitor may be included in a DRAM cell.

According to another aspect of the embodiments, an interlayer insulation film may be formed on the semiconductor substrate and a bit contact hole may be formed in a selected region of the interlayer insulation film providing an opening to a diffusion region associated with at least one memory cell transistor.

According to another aspect of the embodiments, a barrier film may be formed in a bit contact hole.

According to another aspect of the embodiments, a plug may be formed in the bit contact hole, the plug can include a tungsten film.

According to another aspect of the embodiments, bit lines may be formed providing an electrical connection between a column of memory cells. The bit line may include a TiN film having a thickness of approximately 30~50 nm.

DETAILED DESCRIPTION OF THE EMBODIMENTS

Various embodiments of the present invention will now be described in detail with reference to a number of drawings.

A method of making a semiconductor memory cell according to one embodiment will now be explained with reference to FIGS. 1A to 9R. FIGS. 1A to 9R illustrate cross-sections of a semiconductor memory cell after various process steps have been completed.

Figure 1A:
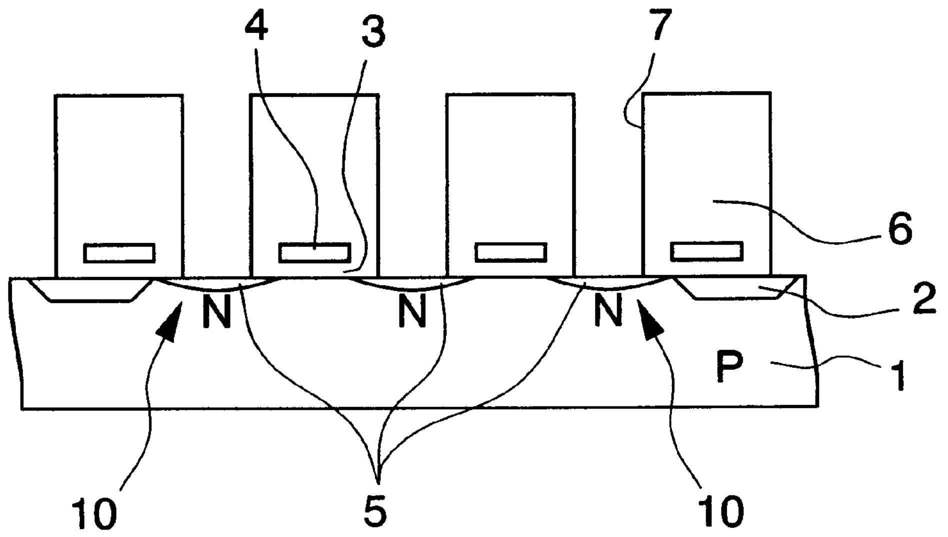
FIG. 1A is a cross sectional view illustrating a semiconductor memory cell, according to one embodiment, after various processing steps have been completed.

Referring now to FIG. 1A, a silicon substrate 1 may have transistors 10 formed in a memory array region. Silicon substrate 1 may comprise P-type silicon, as just one example. A separation insulation film 2 such as silicon oxide, as just one example, can be formed on silicon substrate 1 by LOCOS (local oxidation of silicon) method. Inside active regions that may be surrounded by the separation insulation film 2, a gate oxide film 3 and a gate electrode (word line) 4 can be formed by patterning an oxide film and polysilicon film into desired shapes. A plurality of N-type diffusion regions 5 forming a source region or drain region for transistors 10 can be selectively formed by a dopant introduction method such as ion implantation, while using gate oxide film 3 and gate electrode 4 as a self-aligning mask. Next, a silicon oxide film 6 of approximately 0.5 to 1.0 um film thickness can be formed over the entire surface using a CVD (chemical vapor deposition) method. Silicon oxide film 6 may serve as an interlayer insulation film.

In this manner, an array of MOS-type memory cell transistors 10 may be formed. Each can include a gate (control) electrode 4 and a plurality of N-type diffusion regions 5 forming source/drain regions. In this case, the plurality of N-type diffusion regions 5, forming source/drain regions, may have a LDD (lightly doped drain) structure or it may have a non-LDD structure. A LDD structure can be a combination of a high impurity concentration region and a low impurity concentration region while a non-LDD structure may have only a high impurity concentration region. Next, using a photolithographic method, contact hole 7 may be formed in silicon oxide film 6. Contact hole 7 may expose predetermined N-type diffusion regions 5 which can allow an electrical connection for a capacitor.

Figure 1B:
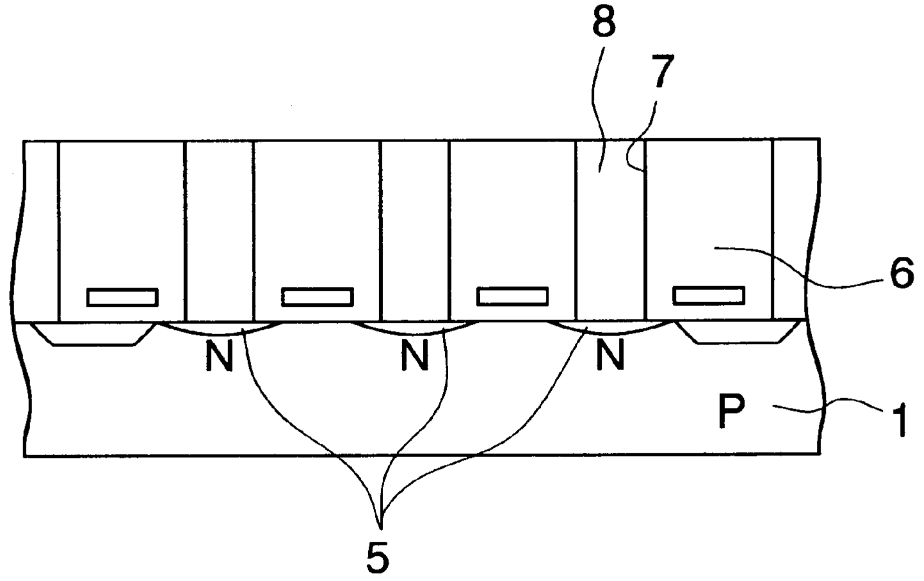
FIG. 1B is a cross sectional view illustrating a semiconductor memory cell, according to one embodiment, after various processing steps have been completed.

Referring now to FIG. 1B, a polysilicon film may be formed over the entire surface using a CVD method. The polysilicon film may be doped with a desired impurity in order to lower the resistance of the film. Next, silicon oxide film 6 can be planarized by etching back its surface to remove unnecessary portions of the doped polysilicon film. This may form a capacitor contact 8 which may comprise doped polysilicon filing inside contact hole 7.

Figure 2C:
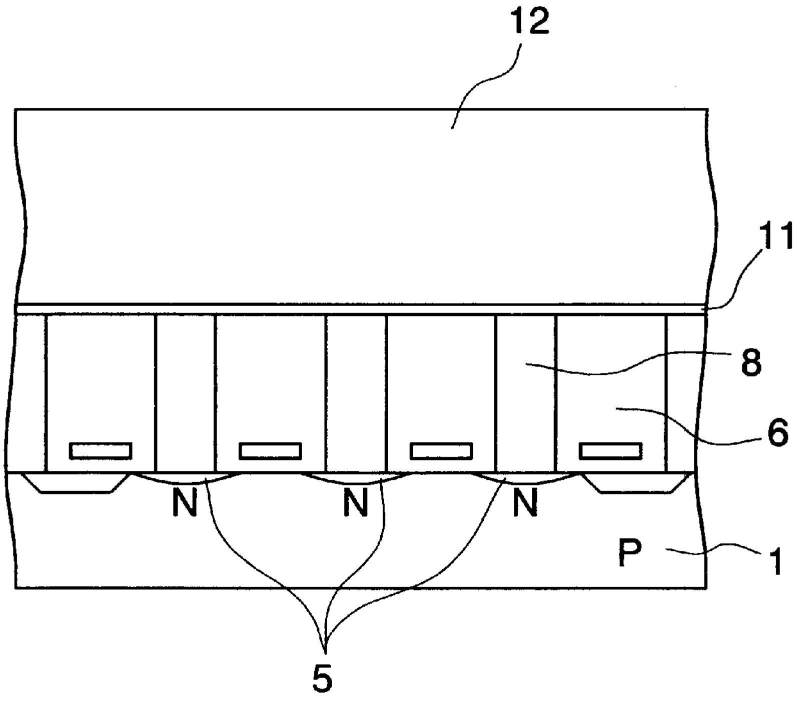
FIG. 2C is a cross sectional view illustrating a semiconductor memory cell, according to one embodiment, after various processing steps have been completed.

Referring now to FIG. 2C, a plasma silicon nitride-oxide film 11 and a plasma silicon oxide film 12 may be successively formed over the entire surface using a plasma CVD method. Plasma silicon nitride-oxide film 11 may have a thickness of approximately 50 nm and plasma silicon oxide film 12 may have a thickness of approximately 1 um.

Figure 2D:
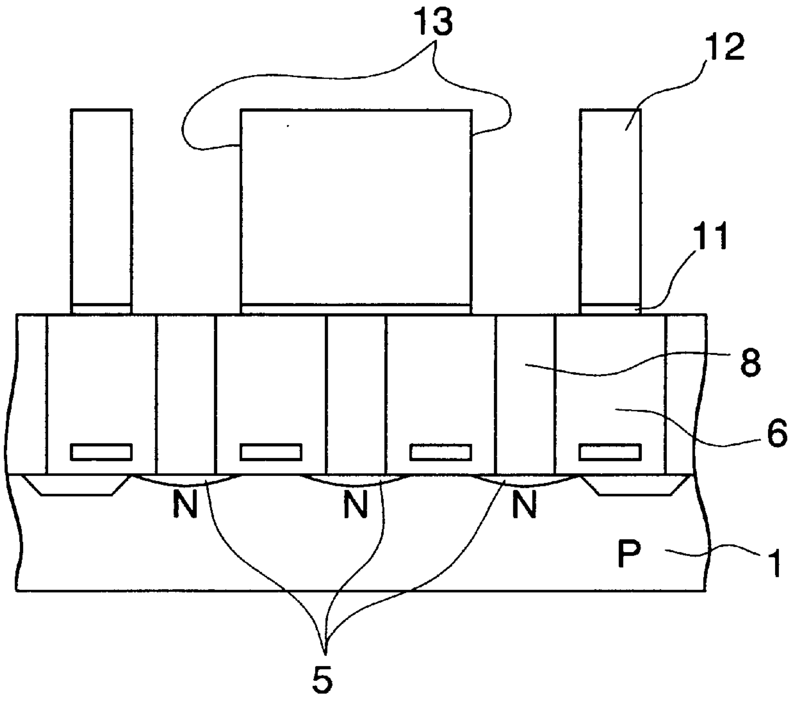
FIG. 2D is a cross sectional view illustrating a semiconductor memory cell, according to one embodiment, after various processing steps have been completed.

Referring now to FIG. 2D, a cylindrical groove 13 may be formed through plasma silicon nitride-oxide film 11 and plasma silicon oxide film 12 by using a photolithograpy and etch step. Cylindrical groove 13 may expose a surface of capacitor contact 8.

Figure 3E:
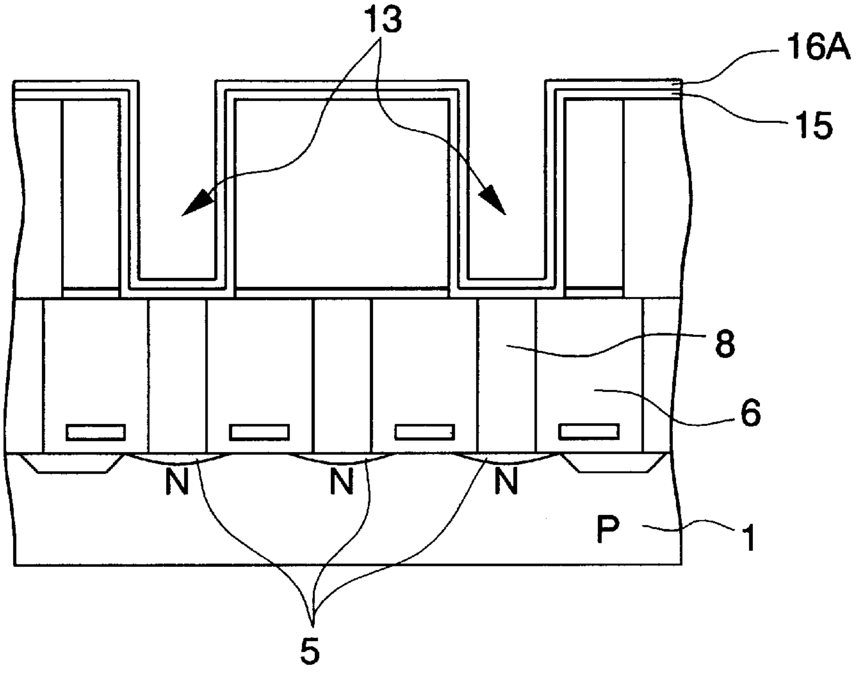
FIG. 3E is a cross sectional view illustrating a semiconductor memory cell, according to one embodiment, after various processing steps have been completed.

Referring now to FIG. 3E, a barrier film 15 can be formed over the entire surface using a CVD method. Barrier film 15 can comprise a TiN film that may have a thickness of approximately 10 nm and a Ti film that may have a thickness of approximately 10 nm. Next, a lower electrode film 16A may be formed over the entire surface using sputtering only or sputtering followed by a CVD method. Lower electrode film 16A may be comprised by a ruthenium (Ru) film and may have a thickness of approximately 5~10 nm. The Ru (ruthenium)-film may have a property such that it can form a conductive oxide film even when it is oxidized, so that it may not adversely affect the capacitance of a capacitor to be formed that may use lower electrode film 16A as a capacitor electrode that may have a capacitor insulation film formed thereon. In this case, barrier film 15 may act in such a way to prevent out-diffusion of unnecessary impurities from capacitor contact 8 comprised by the doped polysilicon film to lower electrode film 16A. Barrier film 15 may also improve bonding of lower electrode film 16A to plasma silicon oxide film 12.

Figure 3F:
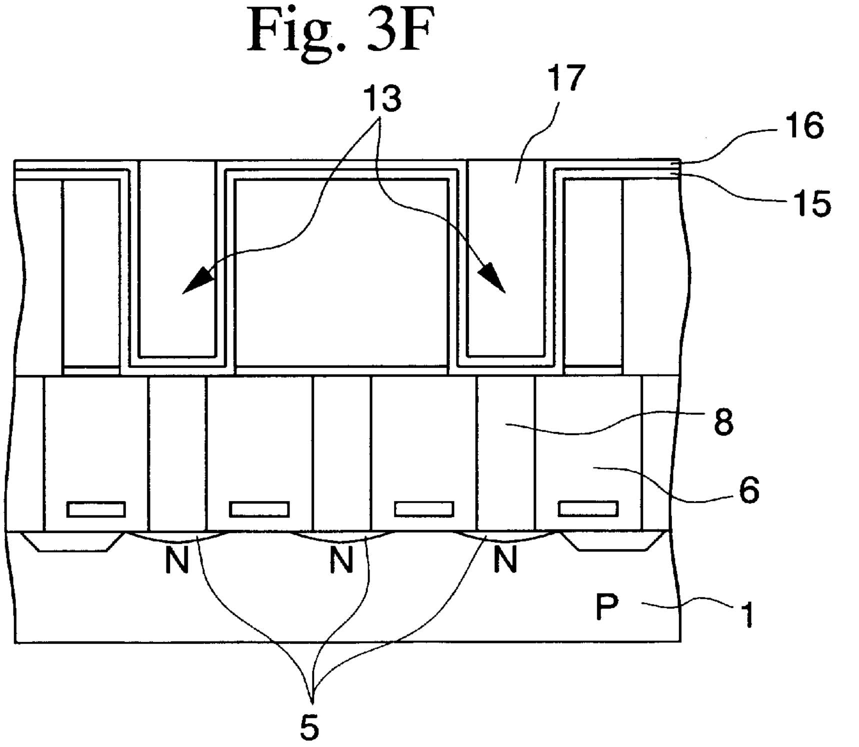
FIG. 3F is a cross sectional view illustrating a semiconductor memory cell, according to one embodiment, after various processing steps have been completed.

Referring now to FIG. 3F, photoresist may be applied over the entire surface. The entire surface may then be exposed and developed so that a resist film 17 may remain in cylindrical groove 13. In this case, it may be necessary to predetermine the coating thickness and degree of exposure of resist film 17 by prior experimentation so that resist film 17 may remain inside cylindrical groove 13 only.

Figure 4G:
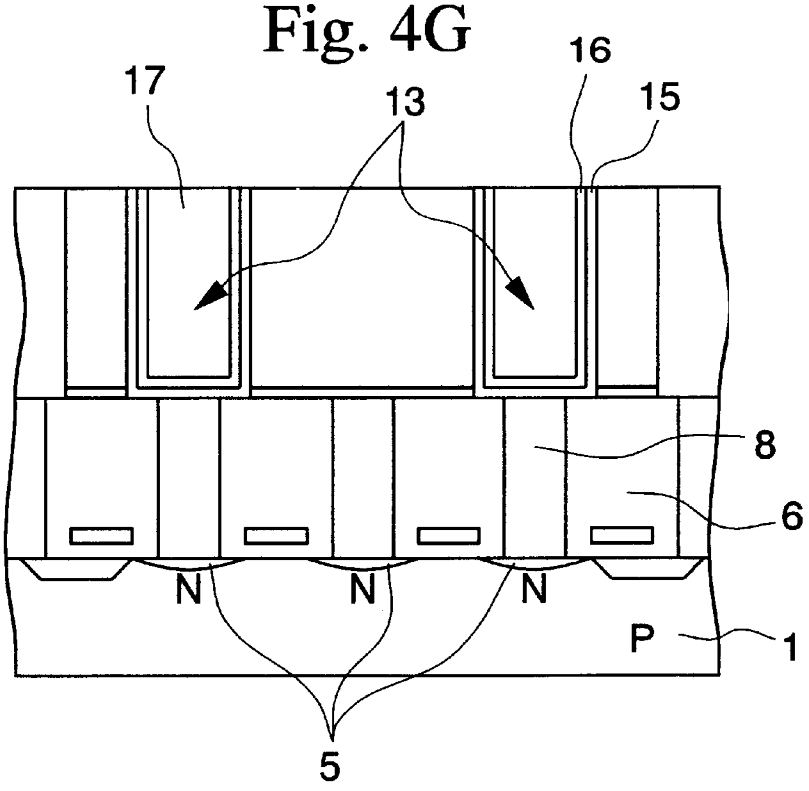
FIG. 4G is a cross sectional view illustrating a semiconductor memory cell, according to one embodiment, after various processing steps have been completed.

Referring now to FIG. 4G, the surface of plasma silicon oxide film 12 may be planarized by etching back its surface. In this way, unnecessary portions of lower electrode film 16A and barrier film 15 may be successively etched. Lower electrode film 16A may thus be patterned to a desired shape to form a lower electrode 16. During the etching back operation, a portion of resist film 17 embedded inside cylindrical groove 13 may be removed.

Figure 4H:
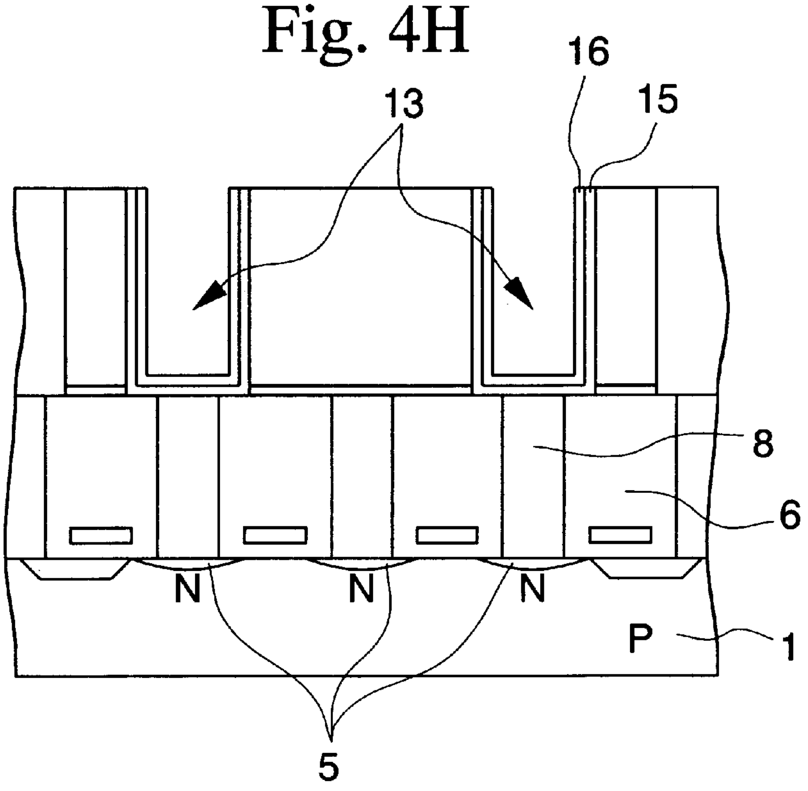
FIG. 4H is a cross sectional view illustrating a semiconductor memory cell, according to one embodiment, after various processing steps have been completed.

Referring now to FIG. 4H, the remaining resist film 17 may be removed from inside cylindrical groove 13 by ashing using an oxygen plasma. Conditions for ashing of silicon substrate 1 which may be held inside a reaction vessel are shown below.

Type of gas and flow rate
  $O_2/N_2$=1000~3000 and 100~200 sccm (standard cubic centimeter per minute)
Power
  1000 W
Internal vessel pressure
  133~665 Pa (pas, pascal)
Substrate temperature
  200~300° C.

When it is desired to form lower electrode 16 by fabricating lower electrode film 16A using the steps illustrated in FIGS. 3F to 4H as described above, the quality of lower electrode 16 may deteriorate due to damage that may be produced on the surface of lower electrode 16. Such damage may particularly be introduced during ashing of resist film 17 using oxygen plasma during the step illustrated in FIG. 4H.

Next, an aqueous mixture of dimethyl sulfoxide and ammonium fluoride, as just one example, may be used to rinse the substrate 1. This may completely detach residual substances (organic substance such as hydrocarbons, carbon, and the like) that may remain from the step of ashing the resist film.

Figure 5I:
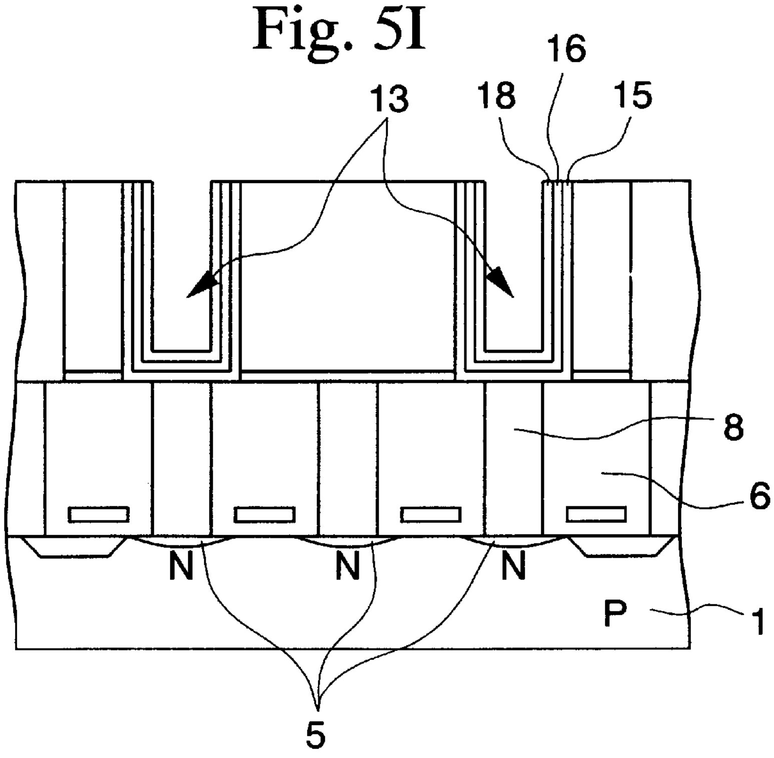
FIG. 5I is a cross sectional view illustrating a semiconductor memory cell, according to one embodiment, after various processing steps have been completed.

Referring now to FIG. 5I, a selective growth film 18 may be grown selectively on the surface of lower electrode 16 only by using a CVD method. Selective growth film 18 may comprise a Ru-film having a thickness of approximately 5~10 nm. Selective growth film 18 may serve as a buffer film, which may prevent the capacitor insulation film from undergoing deterioration effects introduced on the surface of lower electrode 16 during the fabrication step of the lower electrode 16 thereby affecting the quality of the capacitor insulation film. This will be explained in more detail later. The conditions for selective growth on the substrate 1 held in a reaction vessel are as follows:

Type of gas
  $Ru(EtCp)_2$, $O_2$ and $N_2$
Vessel internal pressure
  less than about 1330 Pa
Substrate temperature
  less than about 500° C.

Some specific metals such as Ru may have a characteristic feature of selective growth such that although they may hardly grow on insulating films such as silicon oxide film, but may grow on metallic underlayer surfaces such as lower electrode 16. Thus, by utilizing such a property as selective growth, it may be possible to form the moderating film on the surface of lower electrode 16 only.

Figure 11:
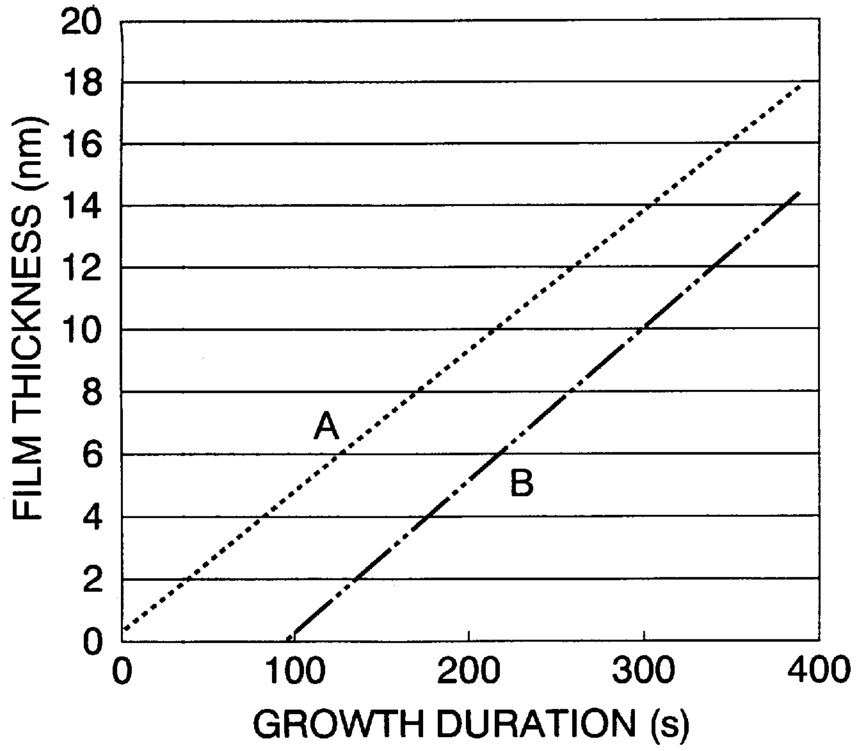
FIG. 11 is a graph illustrating a relationship between film thickness and film forming duration when a selective growth film is grown under conditions in accordance with an embodiment.
Figure 12A:
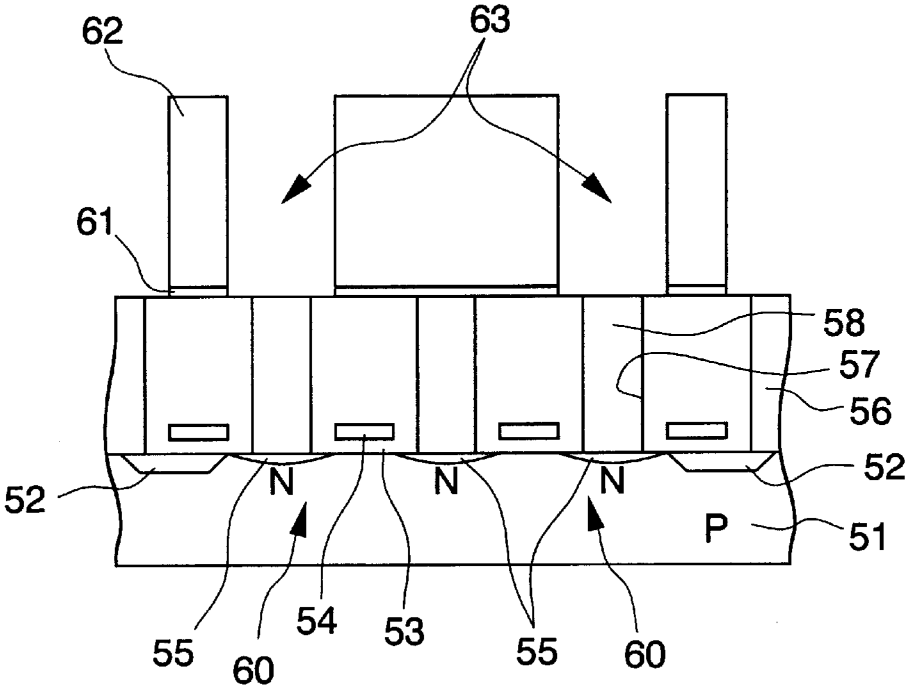
FIG. 12A is a cross sectional view, illustrating a conventional semiconductor memory cell after various processing steps have been completed.
Figure 12B:
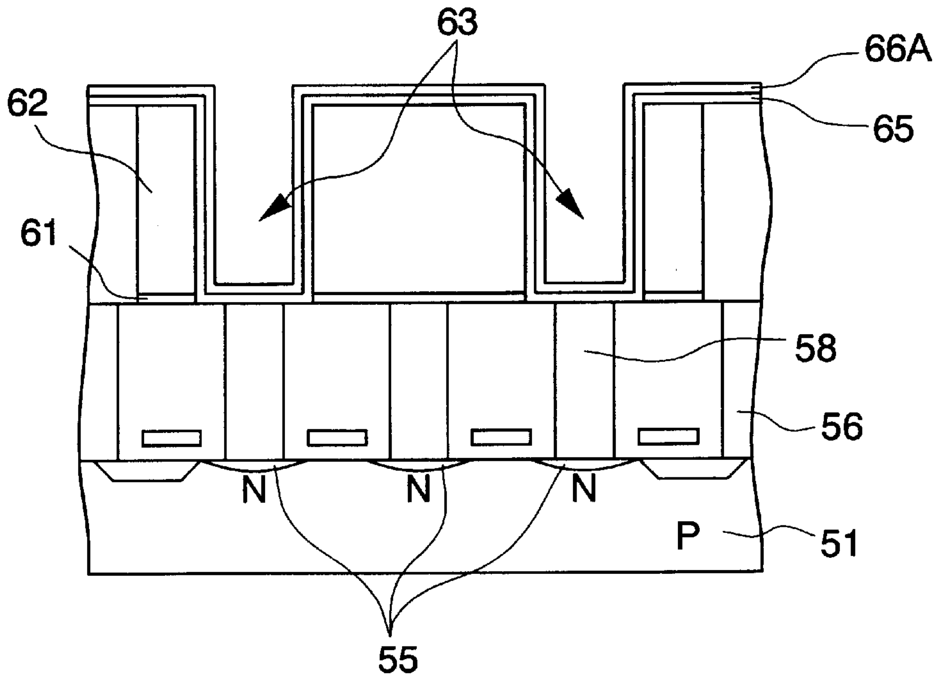
FIG. 12B is a cross sectional view, illustrating a conventional semiconductor memory cell after various processing steps have been completed.
Figure 13C:
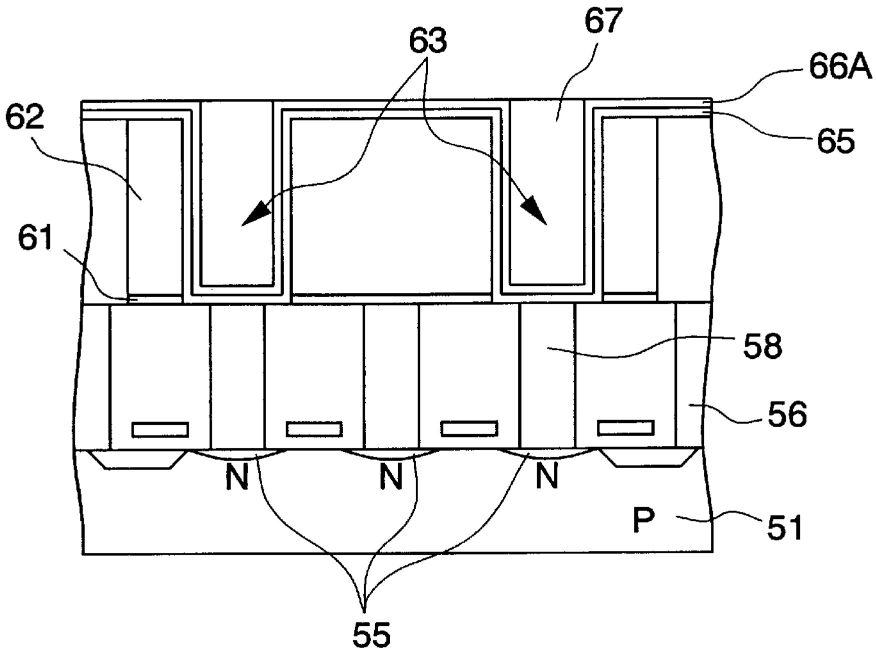
FIG. 13C is a cross sectional view, illustrating a conventional semiconductor memory cell after various processing steps have been completed.
Figure 13D:
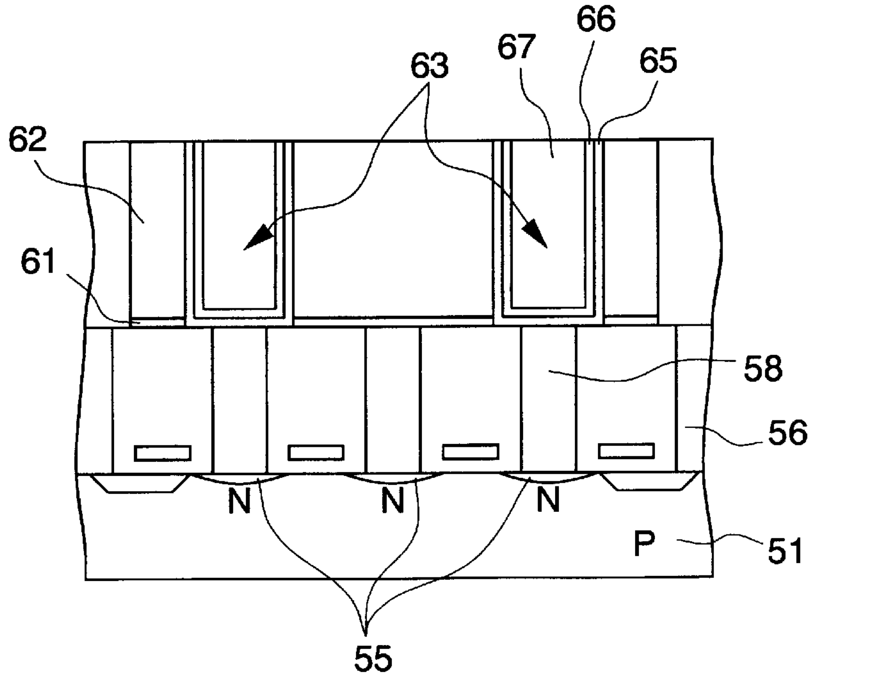
FIG. 13D is a cross sectional view, illustrating a conventional semiconductor memory cell after various processing steps have been completed.
Figure 14E:
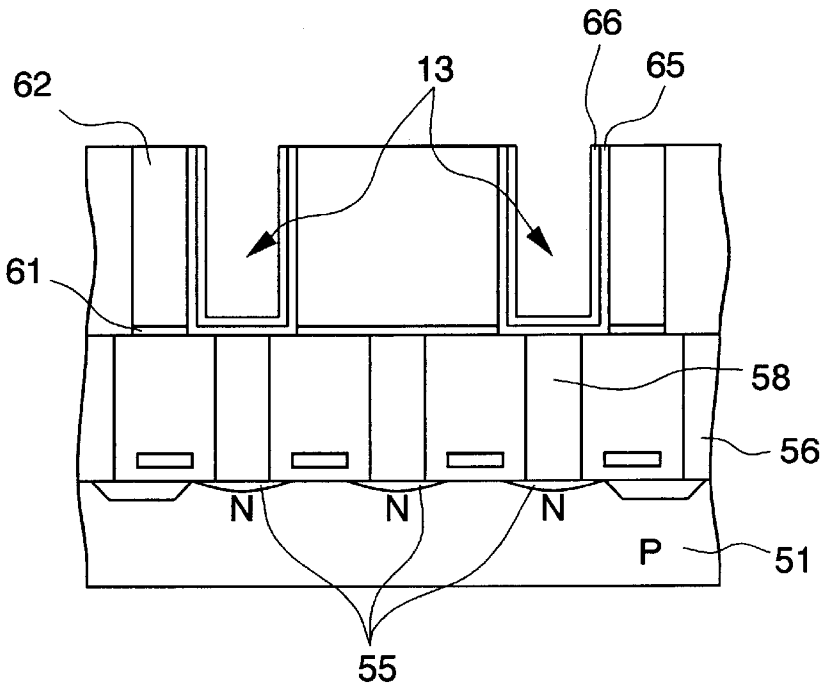
FIG. 14E is a cross sectional view, illustrating a conventional semiconductor memory cell after various processing steps have been completed.
Figure 14F:
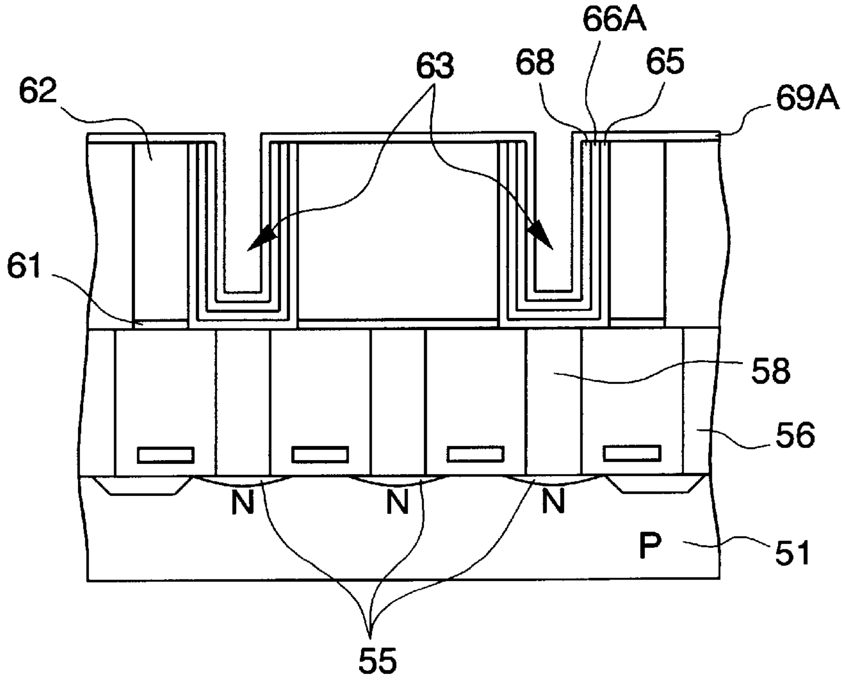
FIG. 14F is a cross sectional view, illustrating a conventional semiconductor memory cell after various processing steps have been completed.
Figure 15A:
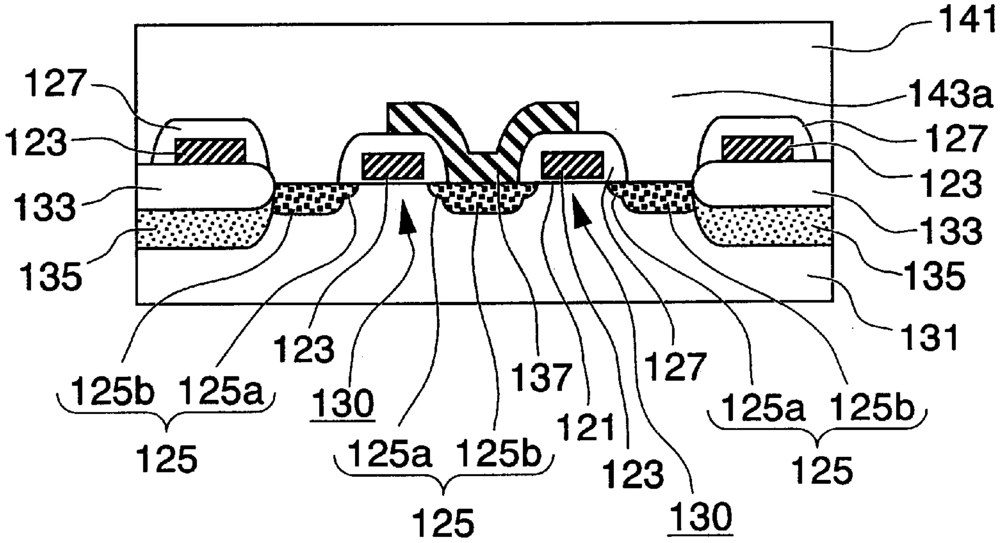
FIG. 15A is a cross sectional view, illustrating a conventional semiconductor memory cell after various processing steps have been completed.
Figure 15B:
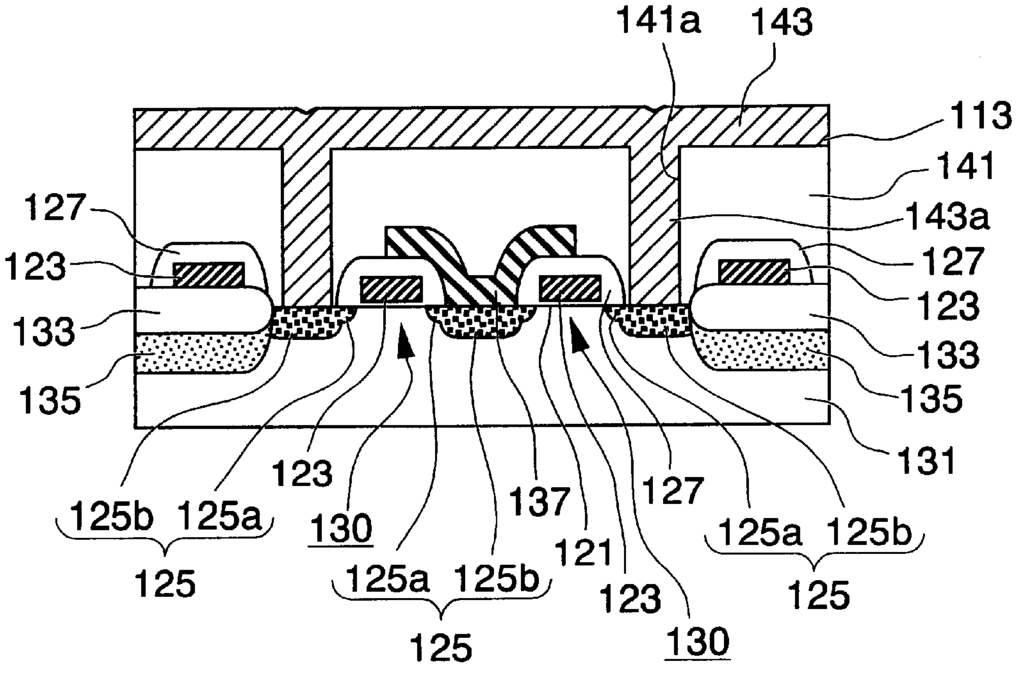
FIG. 15B is a cross sectional view, illustrating a conventional semiconductor memory cell after various processing steps have been completed.
Figure 16C:
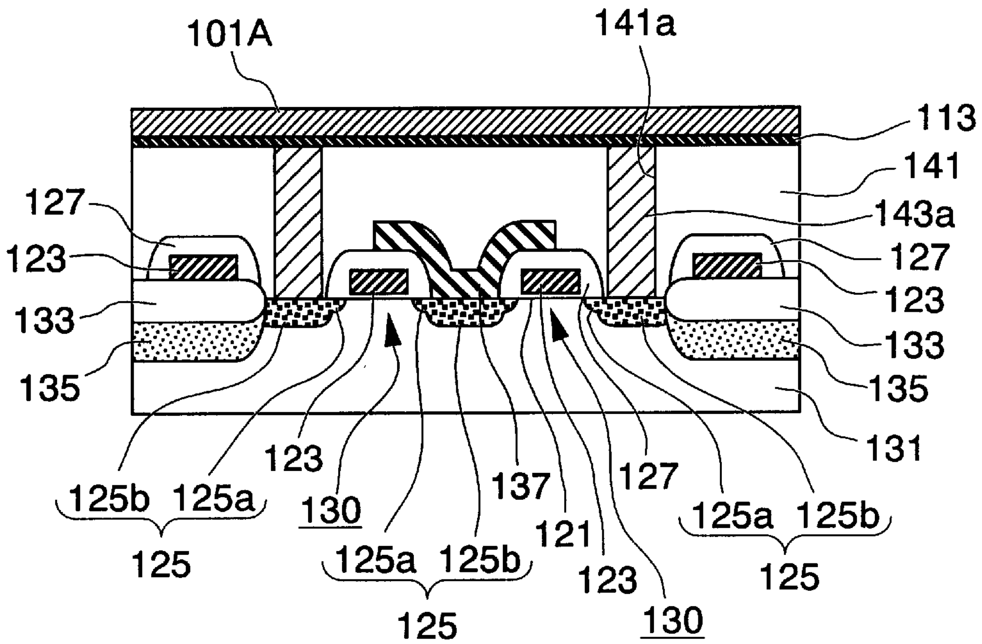
FIG. 16C is a cross sectional view, illustrating a conventional semiconductor memory cell after various processing steps have been completed.
Figure 16D:
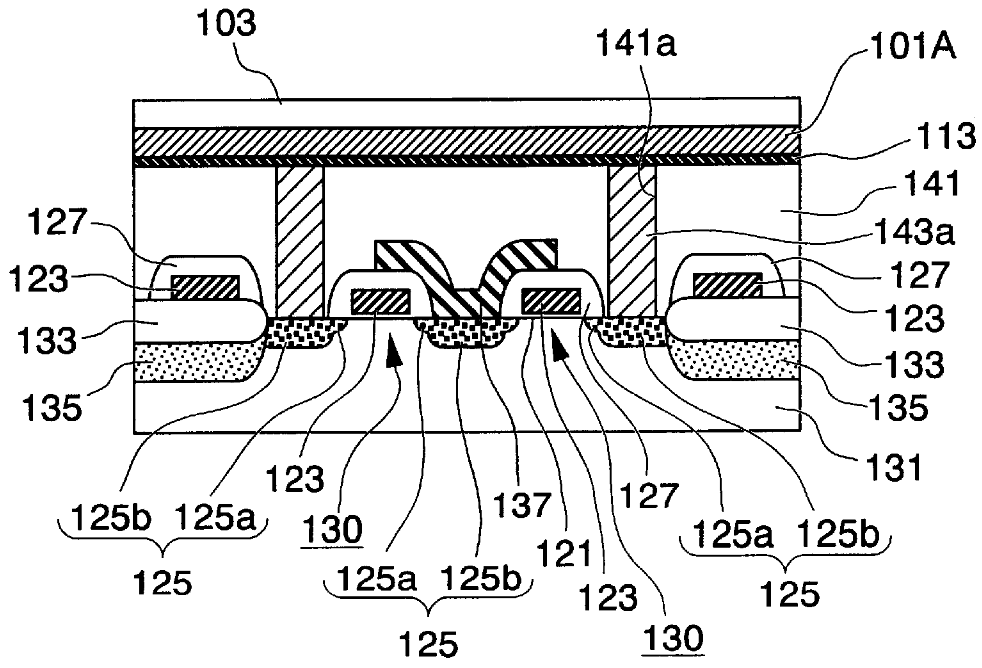
FIG. 16D is a cross sectional view, illustrating a conventional semiconductor memory cell after various processing steps have been completed.

Referring now to FIG. 11, a relationship between film thickness (vertical axis) and film forming duration (horizontal axis) when selective growth film 18 is grown under the above conditions is set forth. In FIG. 11, line A can illustrate the growth of Ru-film on lower electrode 16. Line B can illustrate the growth of Ru-film on plasma silicon oxide film 12. By comparing the growth behaviors illustrated in FIG. 11, it may be seen that selective growth film 18 may grow selectively on lower electrode 16, which may be a metallic film, during the initial growth process. Selective growth film 18 may have different incubation period when growing on an insulation film. The different incubation period may be advantageously used to grow selective growth film 18 only on predetermined selected areas.

Figure 5J:
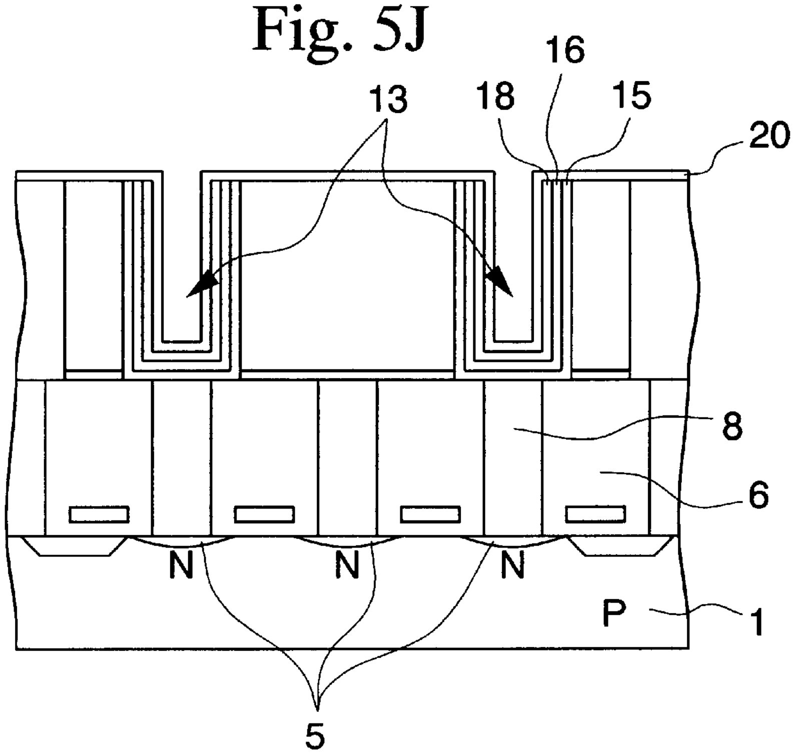
FIG. 5J is a cross sectional view illustrating a semiconductor memory cell, according to one embodiment, after various processing steps have been completed.

Referring now to FIG. 5J, a capacitor insulation film 20 may be formed over the entire surface using a CVD method. Capacitor insulation film 20 may comprise a $Ta_2O_5$ film having a film thickness of approximately 5~20 nm. The conditions for growing the $Ta_2O_5$ film may be as follows:

Type of gas and flow rate
  $Ta(OC_2H_5)_5/O_2$=0.1/2000 sccm
Vessel internal pressure
  about 66 Pa
Substrate temperature
  about 450° C.

Figure 6K:
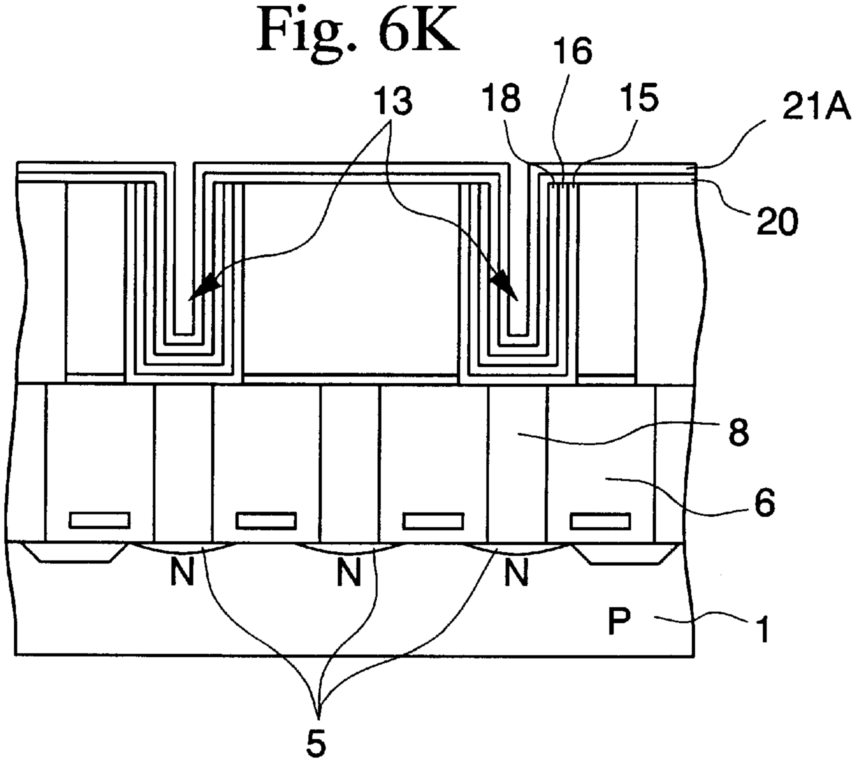
FIG. 6K is a cross sectional view illustrating a semiconductor memory cell, according to one embodiment, after various processing steps have been completed.

Referring now to FIG. 6K, an upper electrode film 21A may be formed over the entire surface using a CVD method. Upper electrode film 21A may comprise a Ru-film having a thickness of approximately 10~20 nm.

Figure 6L:
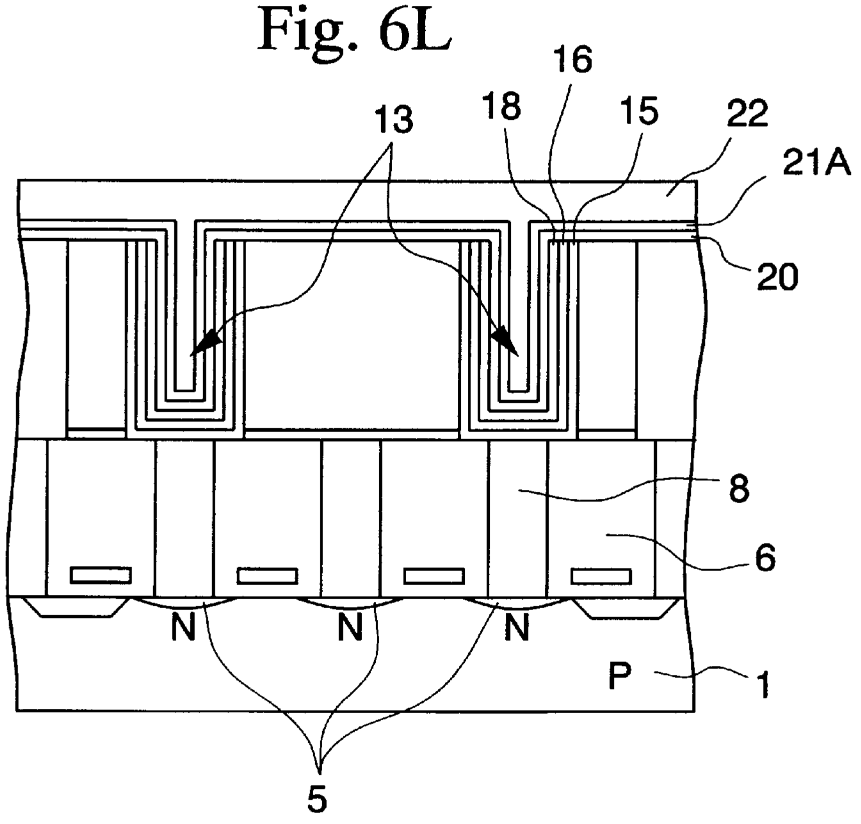
FIG. 6L is a cross sectional view illustrating a semiconductor memory cell, according to one embodiment, after various processing steps have been completed.

Referring now to FIG. 6L, a tungsten (W) film 22 may then be formed over the entire surface using a CVD method. Tungsten film 22 may have a thickness of approximately 100~150 mn. After patterning, tunsten film 22 together with Ru-film 21A may comprise an upper electrode film for a memory cell capacitor. Tungsten film 22 may provide sufficient step-coverage, thus, it may be suitable for filling cylindrical groove 13 even when the diameter is fine. Furthermore, tungsten film 22 may be less expensive than a Ru-film, thus lowering material costs for electrodes.

Figure 7M:
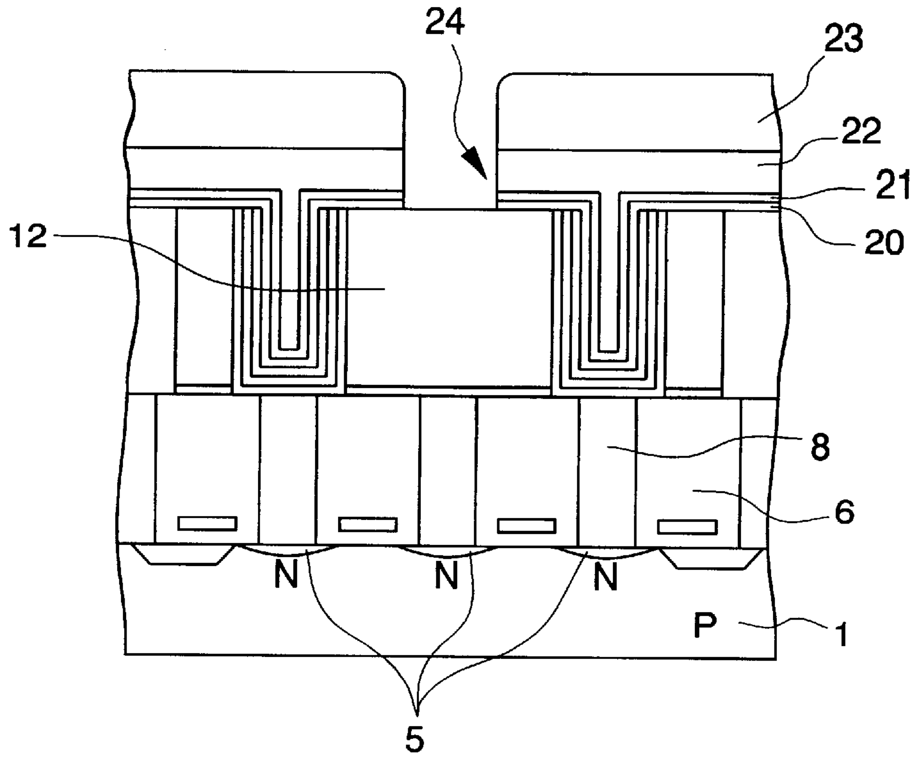
FIG. 7M is a cross sectional view illustrating a semiconductor memory cell, according to one embodiment, after various processing steps have been completed.

Referring now to FIG. 7M, a resist film 23 may be formed on the entire surface except in selected areas in which bit contacts may be subsequently formed. Resist film 23 may then be used as a mask and tungsten film 22, upper electrode film 21A, and capacitor insulation film 20, may be successively patterned by anisotropic etching. This may allow plasma silicon oxide film 12 to be exposed. In this manner, upper electrode film 21A may be patterned to a desired shape to form upper electrode 21 of a capacitor 24.

Figure 7N:
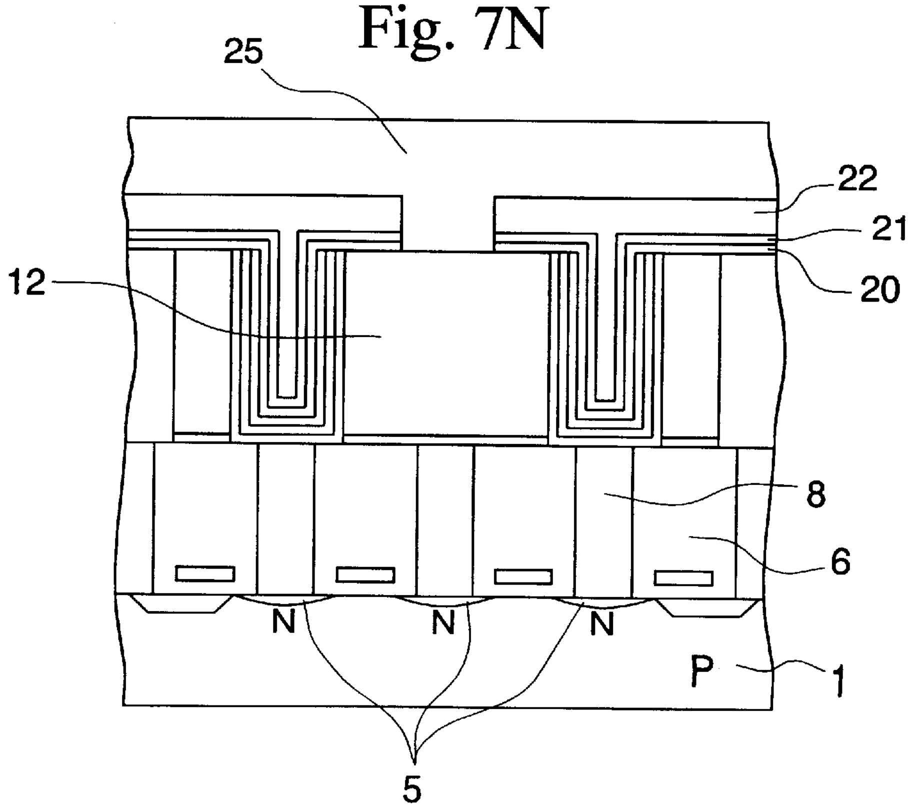
FIG. 7N is a cross sectional view illustrating a semiconductor memory cell, according to one embodiment, after various processing steps have been completed.

Referring now to FIG. 7N, a plasma silicon oxide film 25 may be formed over the entire surface using a plasma CVD method. Plasma silicon oxide film 25 may have a thickness of about 50 nm.

Referring now to FIG. 80, a resist film 26 may be formed on the surface. Resist film 26 may be used as a mask. Plasma silicon oxide film 25, plasma silicon oxide film 12, and plasma silicon nitride film 11 may be successively patterned by anisotropic etching to form a bit contact hole 27. Bit contact hole 27 may expose a shared source/drain region of a pair of memory cell transistors.

Figure 8O:
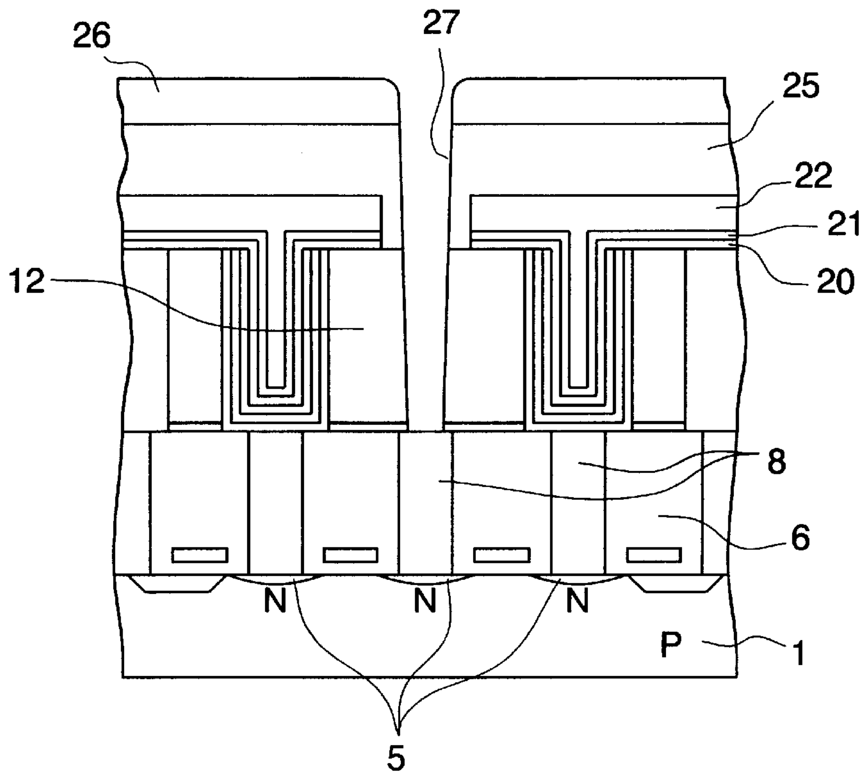
FIG. 8O is a cross sectional view illustrating a semiconductor memory cell, according to one embodiment, after various processing steps have been completed.
Figure 8P:
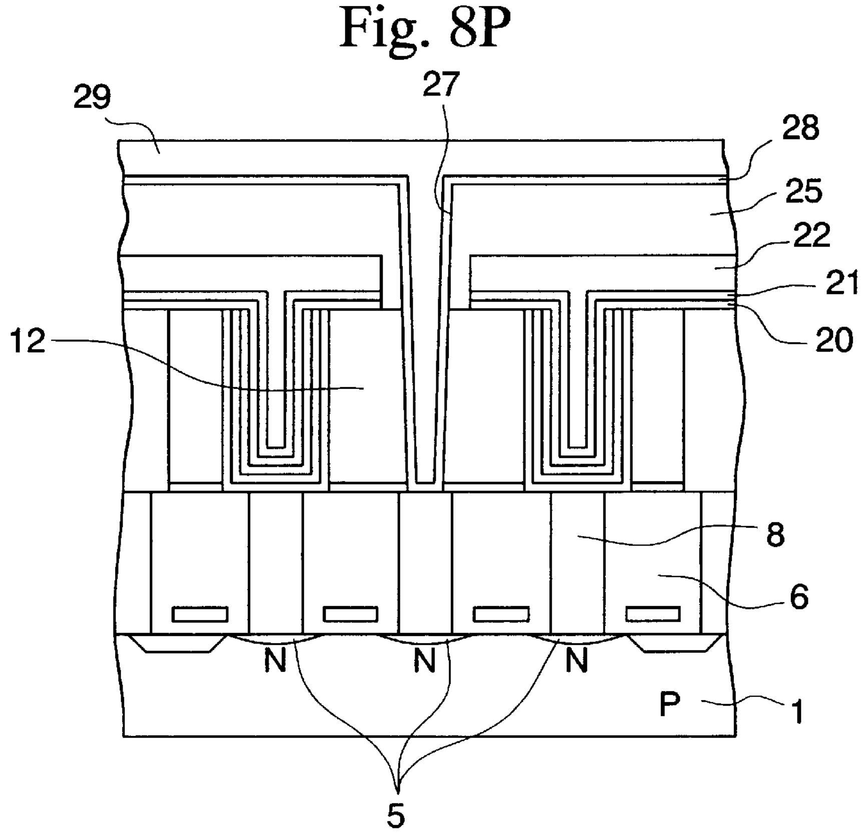
FIG. 8P is a cross sectional view illustrating a semiconductor memory cell, according to one embodiment, after various processing steps have been completed.

Referring now to FIG. 8P, a barrier film 28 may be formed over the entire surface using a CVD method. Barrier film 28 may comprise a lamination of a TiN film and a Ti-film. TiN film may have a thickness of approximately 10 nm and Ti-film may have a thickness of approximately 10 nm. Next, a tungsten film 29 may be formed over the entire surface using a CVD method. Tungsten film 29 may have a thickness of approximately 50 nm.

Figure 9Q:
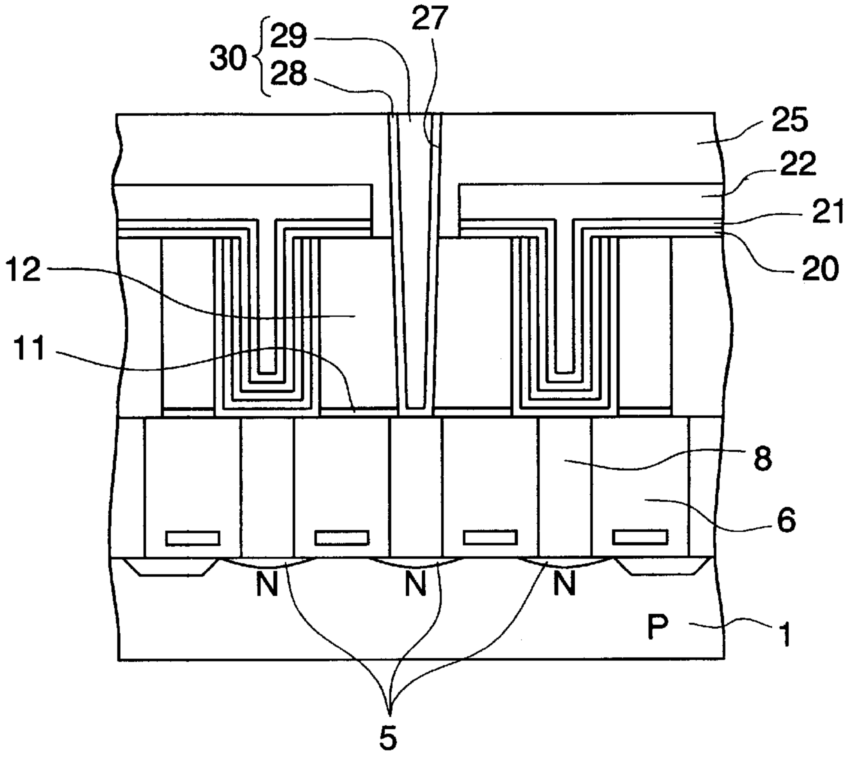
FIG. 9Q is a cross sectional view illustrating a semiconductor memory cell, according to one embodiment, after various processing steps have been completed.

Referring now to FIG. 9Q, unnecessary portions of barrier film 28 and tungsten film 29 may be removed using a CMP (chemical mechanical polishing) method. Bit contact 30 may thus be formed. Bit contact 30 may be comprised of barrier film 28 and tungsten film 29 in bit contact hole 27.

Figure 9R:
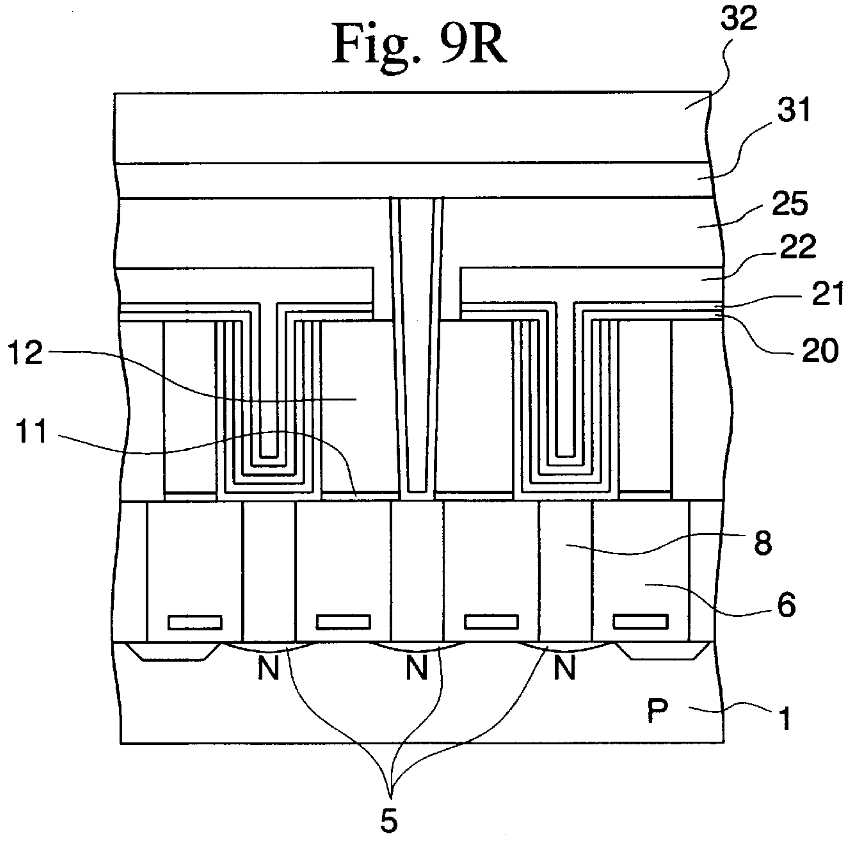
FIG. 9R is a cross sectional view illustrating a semiconductor memory cell, according to one embodiment, after various processing steps have been completed.

Referring now to FIG. 9R, a TiN film 31 may be formed over the entire surface. TiN film 31 may have a thickness of approximately 30~50 nm which may be produced using a CVD method. TiN film 31 may then be patterned and may form bit lines and may electrically connect memory cells in a column direction in the semiconductor memory array. An insulation protection film 32 may then be formed over the entire surface thus completing the semiconductor memory cell. Insulation protection film 32 may be a silicon oxide film.

As described above, the present method of manufacturing a semiconductor memory cell may include the following steps of: forming lower electrode film 16A comprised of a Ru-film; using resist film 17 as a mask, removing unnecessary portions of lower electrode film 16A to form lower electrode 16; removing the resist by ashing; growing selective growth film 18 comprised of Ru-film functioning as a buffer film on the surface of lower electrode 16; forming capacitor insulation film 20 comprised of a $Ta_2O_5$ film such that capacitor insulation film 20 may contact selective growth film 18 and may not contact lower electrode 16. Therefore, capacitor insulation film 20 may grow to reflect film properties of the underlying selective growth film 18 whose surface many not be degraded. For this reason, even if the surface of lower electrode 16 has been damaged by the application of an oxygen plasma during ashing of resist film 17, thus resulting in changed properties, capacitor insulation film 20 may not degrade. This may be due to the oxygen plasma not affecting property changes of selective growth film 18.

Unlike the previously described conventional method, there may be no need for forming a sidewall insulation film for capacitor insulation film 20. Therefore, the step for making a sidewall insulation may be eliminated, in order that capacitor insulation film 20 may not be damaged.

Figure 17E:
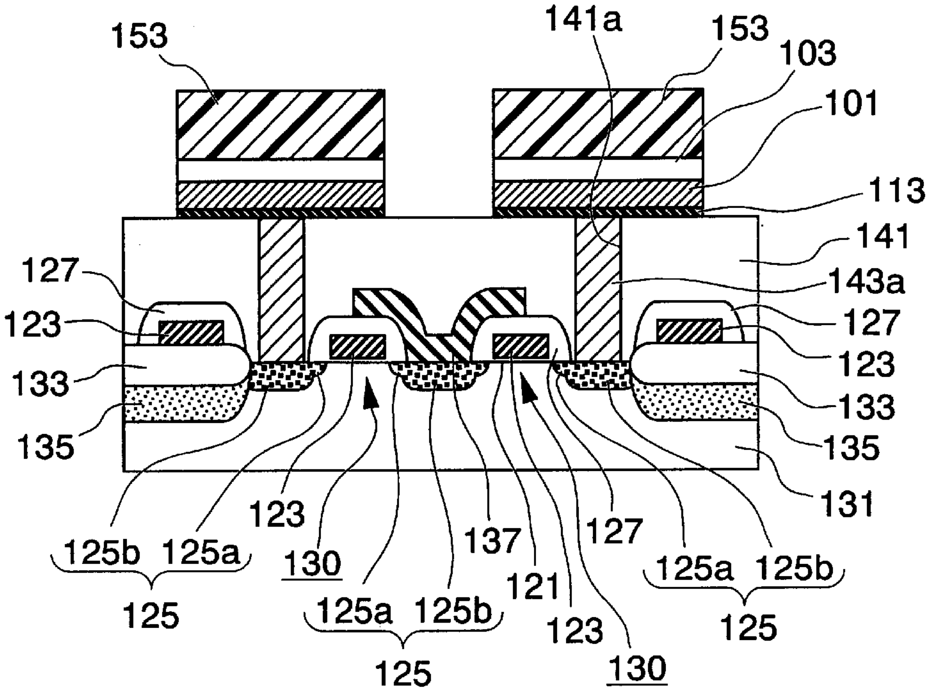
FIG. 17E is a cross sectional view, illustrating a conventional semiconductor memory cell after various processing steps have been completed.
Figure 17F:
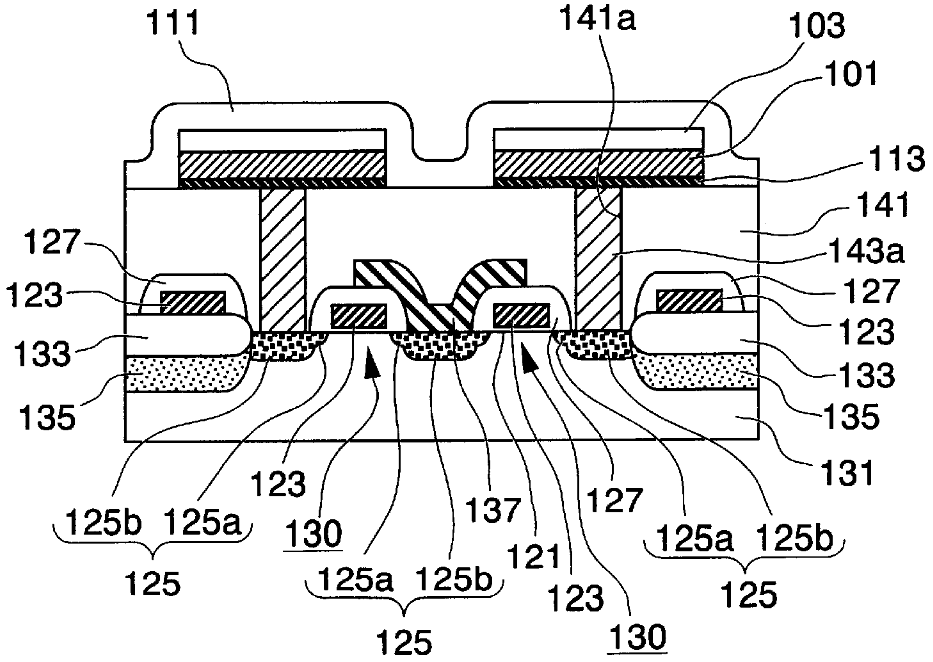
FIG. 17F is a cross sectional view, illustrating a conventional semiconductor memory cell after various processing steps have been completed.
Figure 18G:
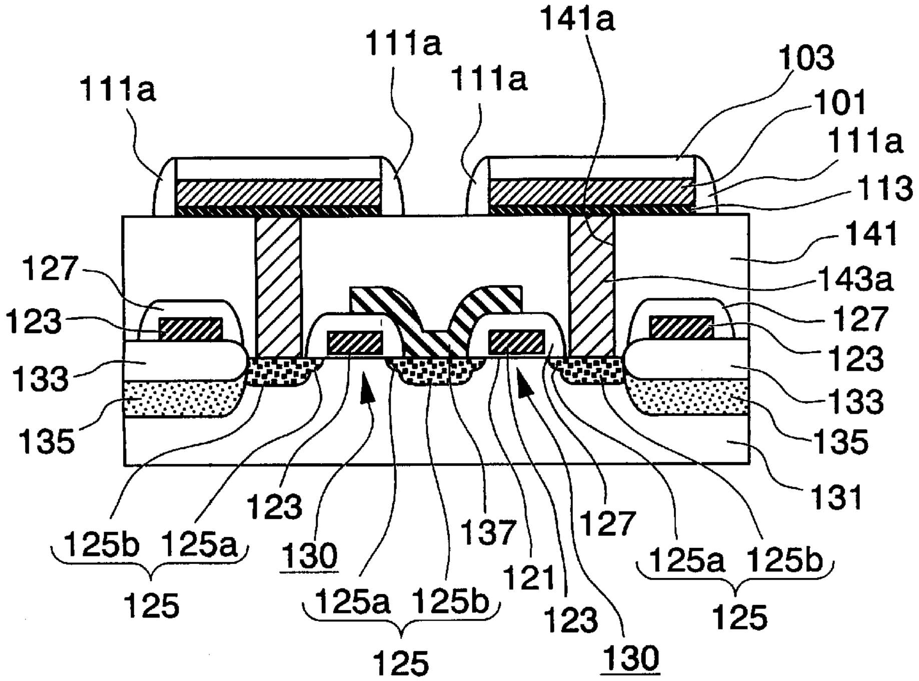
FIG. 18G is a cross sectional view, illustrating a conventional semiconductor memory cell after various processing steps have been completed.
Figure 18H:
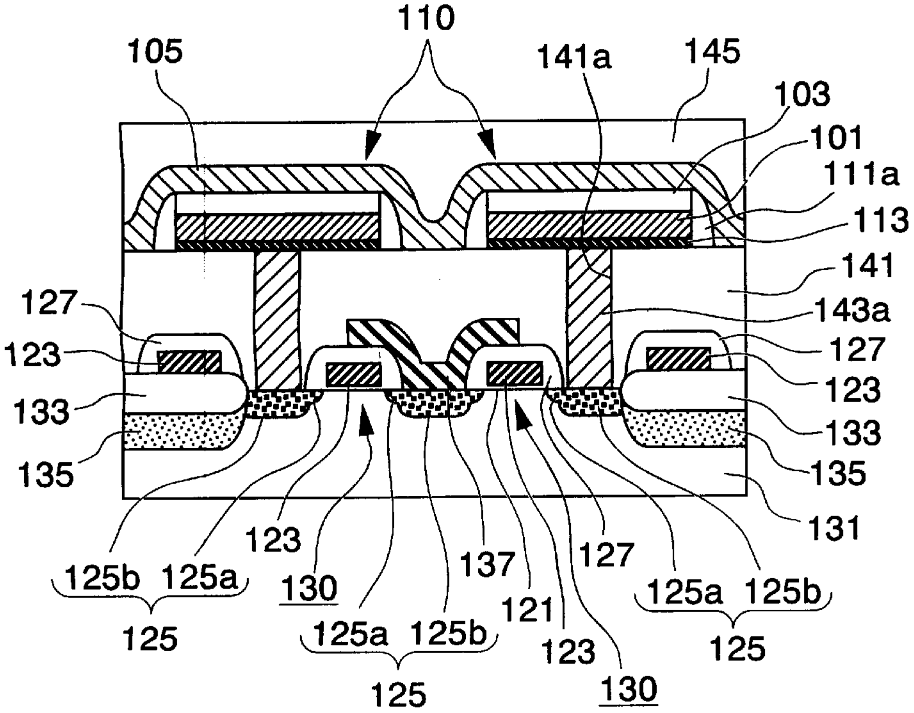
FIG. 18H is a cross sectional view, illustrating a conventional semiconductor memory cell after various processing steps have been completed.
Figure 19:
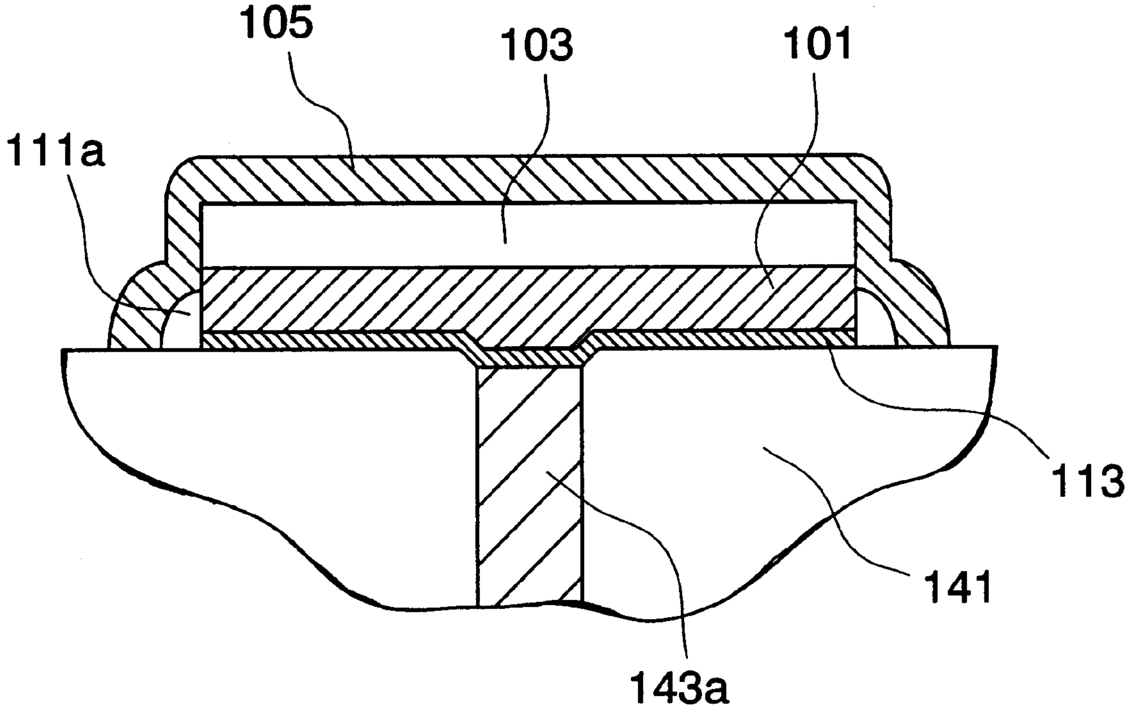
FIG. 19 is a cross sectional view, illustrating a conventional semiconductor memory cell capacitor after a sidewall has been overetched.

In the above example, there may be no need for a step to form insulation film 111 as illustrated in FIG. 17F. Furthermore, a step to form sidewall insulation film 111*a* (illustrated in FIG. 18G) by etching back insulation film 111 may not be needed. This may enable damage to the fabricated capacitor film to be reduced or eliminated. Because it may not be necessary to form a sidewall insulation film, shorting between lower electrode 101 and upper electrode 105 due to over etching the sidewall insulation film (as illustrated in FIG. 19) may not occur.

Figure 10:
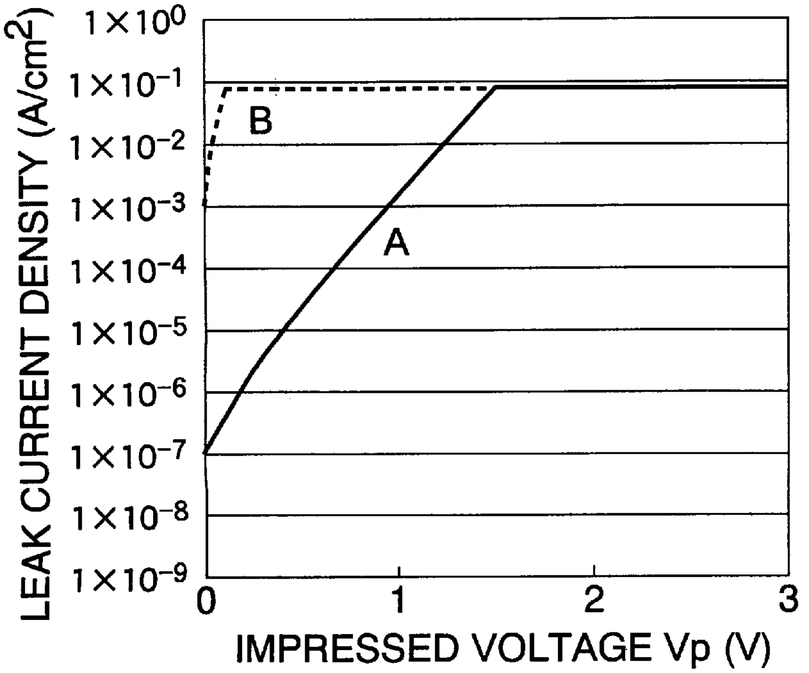
FIG. 10 is a graph illustrating the leakage current properties of a semiconductor capacitor manufactured using a method in accordance with an embodiment and a conventional semiconductor capacitor manufactured according to a conventional method.

Referring now to FIG. 10, a graph illustrating the leakage current properties of a semiconductor memory cell capacitor manufactured in accordance with the above embodiment and a semiconductor memory cell capacitor manufactured using a conventional method is set forth. The graph of FIG. 10 illustrates a relationship between the leakage current density (vertical axis) and the impressed (capacitor) voltage Vp (horizontal axis). Curve A can illustrate leakage current density for a memory cell capacitor manufactured in accordance with the above embodiment. Curve B can illustrate leakage current density for a memory cell capacitor manufactured using a conventional method. It may be seen in FIG. 10, curve A illustrates that leakage current can be relatively low when the impressed voltage Vp is low. However, curve B illustrates that leakage current can be relatively high even at a low impressed voltage, which may be undesirable.

As explained above, in accordance with procedures in this example, when making a capacitor in cylindrical groove 13 formed in interlayer insulation film comprising plasma nitride-oxide film 11 and plasma silicon oxide film 12, a lower electrode film 16A comprised of Ru-film may be formed. Then, using resist film 17 as a mask, unnecessary portions of lower electrode film 16A may be removed to form lower electrode 16. After removing resist film 17 by ashing, a selective growth film 18 comprised of Ru-film, may be grown and as a buffer film on the surface of the lower electrode only. A capacitor insulation film 20 comprised of a $Ta_2O_5$ film may be formed. The effects of deterioration in the quality of films, which may be produced during fabrication of lower electrode, may be prevented. In this manner, data loss caused by capacitor leakage current may be reduced without the step of making a sidewall insulation film for the capacitor insulation film.

Capacitor insulation film may not be damaged and capacitor leakage current may not be increased.

It is understood that the embodiments described above are exemplary and the present invention should not be limited to those embodiments. Specific structures should not be limited to the described embodiments.

For example, examples that may be related to making of capacitor components on a semiconductor memory, such as a DRAM, may be applied to making individual capacitor devices on other semiconductor devices. Furthermore, the barrier film formed below the lower electrode may not be limited to a laminate film of TiN/Ti, other materials, such as tantalum nitride (TaN) as just one example, may be used. Also, metals for selective growth capability may not be limited to Ru, other metals, including tungsten (W), tungsten nitride (WN), platinum (Pt) as just a few examples, may be used.

Similarly, the capacitor insulation film may not be limited to $Ta_2O_5$. Other materials, such as lead zirconium titanate (PZT), barium titanate (BTO), and strontium titanate (STO) as just a few examples, may also be used. Also, although the three dimensional structure of the capacitor was exemplified by a cylindrical type, it may include other shapes such as box or fin type, as just two examples. In addition, the structure of the semiconductor memory cell was exemplified by a CUB (capacitor under bit line) configuration, however, the method may also be applied to a COB (capacitor over bit line) configuration, as just one example.

It is understood that the embodiments described above are exemplary and the present invention should not be limited to those embodiments.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A method for manufacturing a semiconductor memory having an array of memory cells, each memory cell including a memory cell transistor electrically connected to a capacitor, comprising the steps of:

forming a memory cell transistor on a semiconductor substrate followed by forming a first interlayer insulation film over a surface resulting after forming the memory cell transistor;

forming a groove for making the capacitor at a predetermined location in the first interlayer insulation film;

forming a lower electrode film over a surface resulting from forming the groove;

applying and processing a resist material so as to leave a resist film in the groove;

removing excess portions of the lower electrode film so as to leave the lower electrode film in the groove;

selectively forming a first metal film on the lower electrode film after applying and processing the resist material; and forming a capacitor insulation film and an upper electrode film over a surface resulting from removing excess portions of the lower electrode film.

2. The method according to claim 1, further including removing the resist film after removing excess portions of the lower electrode film.

3. The method according to claim 2, wherein removing the resist film uses an oxygen plasma.

4. The method according to claim 1, further including the steps of:

forming a second interlayer insulation film over a surface resulting after forming the capacitor insulation film and the upper electrode film;

forming a bit contact hole by removing selected portions of the second interlayer insulation film and first interlayer insulation film to expose a source/drain region of the memory cell transistor;

forming a second metal film in the bit contact hole; and forming bit lines on the second interlayer film so as to electrically connect a column of memory cells.

5. The method according to claim 1, wherein selectively forming a first metal film on the lower electrode film is carried out by means selected from the group consisting of chemical vapor deposition, physical vapor deposition, and a combination of chemical vapor deposition and physical vapor deposition.

6. The method according to claim 1, wherein the first metal film on the lower electrode film includes ruthenium.

7. The method according to claim 1, wherein the groove is cylindrical.

8. A method for manufacturing a semiconductor memory having an array of memory cells, comprising the steps of:

forming a memory cell transistor on a semiconductor substrate followed by forming a first interlayer insulation film over a surface resulting after forming the memory cell transistor;

forming a capacitor contact hole in the first interlayer insulation film to expose a first diffusion region of the memory cell transistor;

forming a capacitor contact electrically connected to the first diffusion region;

forming a second interlayer insulation film on the first interlayer insulation film;

forming a groove for making a capacitor at a predetermined location in the second interlayer insulation film;

forming a lower electrode film over a surface resulting from forming the groove;

applying and processing a resist material so as to leave a resist film in the groove;

removing excess portions of the lower electrode film so as to leave the lower electrode film in the groove;

selectively forming a first conductive film on the lower electrode film after applying and processing the resist material; and forming a capacitor insulation film and an upper electrode film over a surface resulting from removing excess portions of the lower electrode film.

9. The method according to claim 8, further including removing the resist film after removing excess portions of the lower electrode film.

10. The method according to claim 9, wherein removing the resist film uses an oxygen plasma.

11. The method according to claim 10, wherein the capacitor insulation film comprises at least one of the materials selected from the group consisting of tantalum oxide, lead zirconium titanate, barium titanate, and strontium titanate.

12. The method according to claim 11, wherein the first conductive film on the lower electrode film includes ruthenium.

13. The method according to claim 8, wherein the memory cells are DRAM cells, the method further including the steps of:

forming a third interlayer insulation film over a surface resulting after forming the capacitor insulation film and the upper electrode film;

forming a bit contact hole by removing selected portions of the third interlayer insulation film, the second interlayer insulation film, and the first layer insulation film to expose a source/drain region of the memory cell transistor;

forming a second conductive film in the bit contact hole; and forming bit lines on the third interlayer film so as to electrically connect a column of memory cells.

14. The method according to claim 13, wherein the groove is cylindrical.

15. A method for manufacturing a capacitor formed on a semiconductor substrate, comprising the steps of:

forming a first interlayer insulation film over a surface of the semiconductor substrate;

forming a groove for making the capacitor at a predetermined location in the first interlayer insulation film;

forming a lower electrode film over a surface resulting from forming the groove;

applying and processing a resist material so as to leave a resist film in the groove;

removing excess portions of the lower electrode film so as to leave the lower electrode film in the groove;

forming a conductive film on the lower electrode film after applying and processing the resist material; and forming a capacitor insulation film and an upper electrode film over a surface resulting from removing excess portions of the lower electrode film.

16. The method according to claim 15, further including the steps of:

before forming the first interlayer insulation film, forming a second interlayer insulation film over a surface of the semiconductor substrate;

forming a capacitor contact hole in the second interlayer insulation film to expose a diffusion region in the semiconductor substrate; and forming a capacitor contact electrically connected to the diffusion region.

17. The method according to claim 15, further including removing the resist film after removing excess portions of the lower electrode film.

18. The method according to claim 17, wherein removing the resist film uses an oxygen plasma.

19. The method according to claim 15, wherein the conductive film on the lower electrode film includes a ruthenium film having a thickness of between approximately 5 to 10 nm.

20. The method according to claim 15, wherein the groove is cylindrical.

* * * * *